US010217642B2

(12) United States Patent
Sato et al.

(10) Patent No.: US 10,217,642 B2
(45) Date of Patent: Feb. 26, 2019

(54) SUBSTRATE PROCESSING APPARATUS, SUBSTRATE PROCESSING METHOD AND SUBSTRATE HOLDING MEMBER

(71) Applicant: Tokyo Electron Limited, Tokyo (JP)

(72) Inventors: Jun Sato, Iwate (JP); Shigehiro Miura, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 8 days.

(21) Appl. No.: 15/333,282

(22) Filed: Oct. 25, 2016

(65) Prior Publication Data
US 2017/0125258 A1    May 4, 2017

(30) Foreign Application Priority Data

Nov. 4, 2015  (JP) ................ 2015-216320

(51) Int. Cl.
*H01L 21/67* (2006.01)
*H01J 37/32* (2006.01)
*C23C 16/44* (2006.01)
*H01L 21/3065* (2006.01)
*H01L 21/687* (2006.01)
(Continued)

(52) U.S. Cl.
CPC .... *H01L 21/30655* (2013.01); *C23C 16/4581* (2013.01); *C23C 16/4585* (2013.01); *C23C 16/45551* (2013.01); *H01J 37/32009* (2013.01); *H01J 37/3244* (2013.01); *H01J 37/32513* (2013.01); *H01J 37/32642* (2013.01); *H01J 37/32715* (2013.01); *H01J 37/32724* (2013.01); *H01J 37/32899* (2013.01); *H01L 21/67069* (2013.01); *H01L 21/68735* (2013.01);
(Continued)

(58) Field of Classification Search
CPC ......... H01L 21/67069; H01L 21/68735; H01L 21/68742; H01L 21/68764; H01J 37/32009; H01J 37/2114; H01J 37/32513; H01J 37/32642; H01J 37/32715; H01J 37/32724; H01J 37/32899
USPC ......................... 156/345.1–345.55
See application file for complete search history.

(56) References Cited

U.S. PATENT DOCUMENTS 5,298,720 A * 3/1994 Cuomo ................ C23C 14/564
156/345.39
6,264,467 B1 * 7/2001 Lue .................... C23C 16/4581
211/41.18
(Continued)

FOREIGN PATENT DOCUMENTS

JP    2003-142484    5/2003
JP    2010-056470    3/2010
(Continued)

*Primary Examiner* — Charlee J C Bennett
(74) *Attorney, Agent, or Firm* — IPUSA, PLLC

(57) ABSTRACT

A substrate processing apparatus includes a process chamber, and a turntable provided in the process chamber and including a substrate holding region formed in a top surface along a circumferential direction of the turntable. A surface area increasing region is provided in the top surface of the turntable around the substrate holding region and is configured to increase a surface area of the top surface of the turntable to an area larger than a surface area of a flat surface by including a concavo-convex pattern in its top surface. A process gas supply unit is configured to supply a process gas to the top surface of the turntable.

10 Claims, 17 Drawing Sheets

(51) Int. Cl.
   *C23C 16/455* (2006.01)
   *C23C 16/458* (2006.01)
(52) U.S. Cl.
   CPC .. *H01L 21/68742* (2013.01); *H01L 21/68764* (2013.01); *H01J 2237/3343* (2013.01)

(56) References Cited

U.S. PATENT DOCUMENTS

| | | | |
|---|---|---|---|
| 6,623,595 B1 * | 9/2003 | Han | C23C 16/4404 118/723 AN |
| 6,709,267 B1 * | 3/2004 | Hawkins | C23C 16/4585 118/500 |
| 6,916,399 B1 * | 7/2005 | Rozenzon | H01J 37/321 118/715 |
| 7,070,660 B2 * | 7/2006 | Keeton | C23C 16/45521 118/500 |
| 2005/0051099 A1 * | 3/2005 | Preti | C23C 16/4583 118/728 |
| 2006/0222481 A1 * | 10/2006 | Foree | C23C 16/45521 414/800 |
| 2010/0055320 A1 * | 3/2010 | Honma | C23C 16/45544 427/255.28 |
| 2011/0126985 A1 * | 6/2011 | Ohizumi | C23C 16/45546 156/345.55 |
| 2012/0003599 A1 * | 1/2012 | Patalay | H01L 21/67115 432/227 |
| 2012/0267341 A1 * | 10/2012 | Kato | H01L 21/02164 216/37 |
| 2013/0337635 A1 * | 12/2013 | Yamawaku | H01L 21/02104 438/466 |

FOREIGN PATENT DOCUMENTS

| | | |
|---|---|---|
| JP | 2015-019075 | 1/2015 |
| JP | 2015-173154 | 10/2015 |

\* cited by examiner

SUBSTRATE PROCESSING APPARATUS, SUBSTRATE PROCESSING METHOD AND SUBSTRATE HOLDING MEMBER

CROSS-REFERENCE TO RELATED APPLICATIONS

This patent application is based upon and claims the benefit of priority of Japanese Patent Application No. 2015-216320, filed on Nov. 4, 2015, the entire contents of which are incorporated herein by reference.

BACKGROUND OF THE INVENTION

1. Field of the Invention

The present invention generally relates to a substrate processing apparatus, a substrate processing method and a substrate holding member.

2. Description of the Related Art

Along with progressive miniaturization of circuit patterns of semiconductor devices, a variety of films making up semiconductor devices is demanded to be made thinner and more uniform. In order to respond to the demand, as described in Japanese Laid-Open Patent Application Publication No. 2010-56470, so-called MLD (Molecular Layer Deposition) and ALD (Atomic Layer Deposition) are known as film deposition methods. In the methods, a first reaction gas is adsorbed on a surface of a substrate by supplying the first reaction gas to the substrate, and then a second reaction gas is caused to react with the first reaction gas adsorbed on the surface of the substrate by supplying the second reaction gas to the substrate, thereby depositing a film made of a reaction product on the substrate. According to the film deposition methods, because the reaction gases can adsorb on the surface of the substrate in a quasi-self-saturated manner, high film deposition controllability, excellent uniformity, and superior filling characteristics can be achieved.

However, as aspect ratios of trenches in trench element isolation structures and spaces in line and space patterns increase along with the miniaturization of circuit patterns, filling the trenches and spaces is sometimes difficult even in the molecular layer deposition.

For example, when a space having a width of about 30 nm is tried to be filled with a silicon oxide film, because a reaction gas is unlikely to go into the bottom portion having a narrow space, film thicknesses near the top portion of a side wall forming the space is likely to become thick and to become thin on the bottom side. Because of this, a void may be generated in a silicon oxide film filled in the space. When such a silicon oxide film is etched in an etching process, for example, an opening in communication with the void may be formed in the top surface of the silicon oxide film. On this occasion, contamination is liable to occur because an etching gas (or an etching solution) goes into the void from the opening or a defect is liable to occur because a metal goes into the void during metallization performed later.

Such problems are not limited to MLD, and may occur even in CVD (Chemical Vapor Deposition). For example, when forming a conductive connection hole (i.e., so-called plug) by filling the connection hole with a conductive material, a void may be formed in the plug. Therefore, Japanese Laid-Open Patent Application Publication No. 2003-142484 proposes a method for forming a conductive connection hole (i.e., so-called plug) in which a void is prevented. In the method, a process of removing an overhanging portion of a conductive material formed over the connection hole in filling up the connection hole with the conductive material is repeated in order to prevent generation of the void.

However, in the method described in Japanese Laid-Open Patent Application Publication No. 2003-142484, because the film deposition of the conductive material and the etch back have to be performed by different apparatuses, it takes time to transfer the substrate between the apparatuses and to stabilize process conditions in each of the apparatuses, thereby deteriorating throughput. To solve the problem, Japanese Laid-Open Patent Application Publication No. 2015-19075 proposes a film deposition apparatus and a film deposition method in which a turntable-type ALD apparatus performs a V-letter etching process at high speed in situ.

According to the apparatus and method described in Japanese Laid-Open Patent Application Publication No. 2015-19075, a depressed portion formed in a substrate can be filled up with a film at high throughput while reducing the generation of a void.

However, when filling the depressed portion of a circuit pattern formed in a substrate with a film and then etching the film, if the shape of the depressed portion is fairly complex, because a surface area greatly increases compared to a flat portion, a great difference in the surface area is generated between the portion having the complex circuit pattern and the flat portion in which the circuit pattern is hardly formed. In such a case, when etching the film after depositing the film, a small amount of etching gas is consumed in the flat portion having the small surface area while a large amount of etching gas is consumed in the portion having the large surface area due to a loading phenomenon. However, because an amount of supply of the etching gas is almost uniform for the whole surface of the substrate, an etching rate decreases in the portion with the complex circuit pattern and the etching rate increases in the portion with the simple circuit pattern, which makes it difficult to maintain the favorable uniformity of the etching across the surface of the substrate. Moreover, such a phenomenon can occur in all substrate processes in which the loading phenomenon occurs.

Meanwhile, Japanese Laid-Open Patent Application Publication No. 2015-173154 proposes a film deposition process using a vertical thermal processing apparatus in which a gas distribution adjustment member is disposed above and below a wafer boat to adjust the gas distribution in the vertical direction, thereby being intended to improve the uniformity of the film deposition process in the vertical direction. However, because the technique differs from the film deposition process and the etching process using the turntable, the technique is difficult to apply to the turntable-type substrate processing apparatus.

SUMMARY OF THE INVENTION

Embodiments of the present invention are intended to provide a substrate processing apparatus, a substrate processing method and a substrate holding member that can maintain uniformity of a substrate process across a surface of the substrate even when processing a substrate in which a complex pattern that greatly increases a surface area is formed.

According to one embodiment of the present invention, there is provided a substrate processing apparatus including a process chamber, and a turntable provided in the process chamber and including a substrate holding region formed in a top surface along a circumferential direction of the turntable. A surface area increasing region is provided in the top surface of the turntable around the substrate holding region and is configured to increase a surface area of the top surface of the turntable to an area larger than a surface area of a flat surface by including a concavo-convex pattern in its top surface. A process gas supply unit is configured to supply a process gas to the top surface of the turntable.

According to another embodiment of the present invention, there is provided a substrate processing apparatus including a process chamber, and a turntable provided in the process chamber. A depressed substrate receiving region is provided in a surface of the turntable along a circumferential direction of the turntable and having a diameter larger than a diameter of a substrate to be able to receive the substrate without touching a side surface of the substrate by its inner circumferential surface. At least three substrate holding pins are provided in a bottom surface of the substrate receiving region at positions apart from the inner circumferential surface of the substrate receiving region and along an outer shape of the substrate to be able to hold the substrate against a centrifugal force generated by rotation of the turntable. A process gas supply unit is configured to supply a process gas to the top surface of the turntable.

According to another embodiment of the present invention, there is provided a substrate processing method. In the method, a substrate is placed on substrate holding region formed in a top surface of a turntable provided in a process chamber. The substrate holding region is provided along a circumferential direction of the turntable. A surface area increasing region is provided around the substrate holding region to surround the substrate. The surface area increasing region includes a concavo-convex pattern that increases a surface area to an area larger than a surface area of a flat surface. The turntable is rotated while holding the substrate in the substrate holding region with the surface area increasing region provided therearound. The substrate is processed by supplying a process gas to the substrate while rotating the turntable.

According to another embodiment of the present invention, there is provided a substrate holding member used in a substrate processing apparatus configured to process a substrate while holding the substrate in a predetermined substrate holding region provided in a top surface of a turntable. The substrate holding member includes a substrate holding portion to hold a substrate therein. The substrate holding portion has an inner diameter and a thickness to be able to hold the substrate. The substrate holding member includes a fitting portion to be installed in the substrate holding region of the turntable. The fitting portion includes an outer side surface and an outer bottom surface to be formed to fit in the substrate holding region of the turntable. The substrate holding member further includes a concavo-convex pattern that increases a surface area to an area larger than a surface area of a flat surface and formed in a top surface thereof. The substrate holding member has an annular shape as a whole.

DESCRIPTION OF THE PREFERRED EMBODIMENTS

In the following, embodiments of the present invention will be described with reference to the accompanying drawings.

First Embodiment

Figure 1:
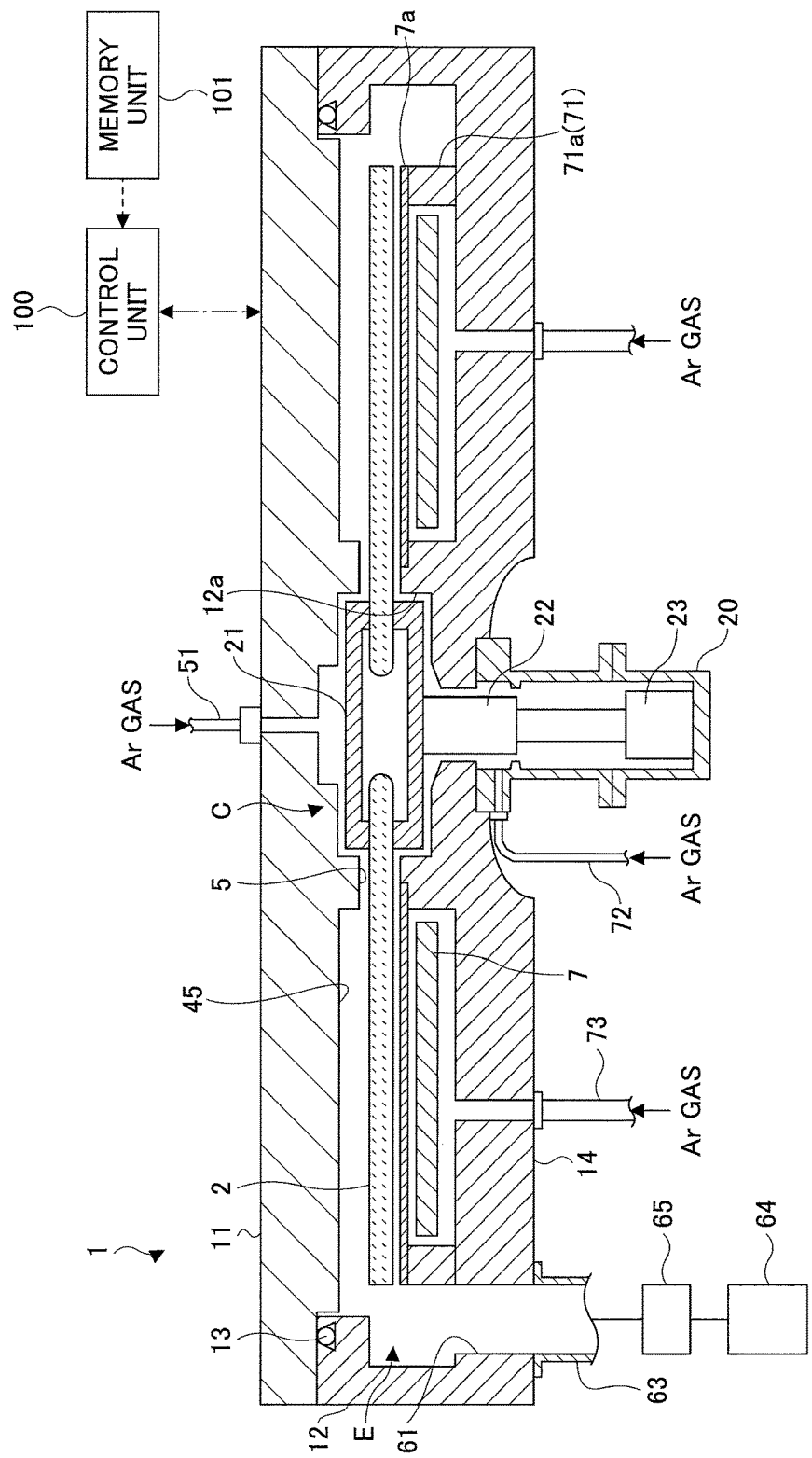
FIG. 1 is a schematic cross-sectional view of a substrate processing apparatus according to an embodiment of the present invention.
Figure 2:
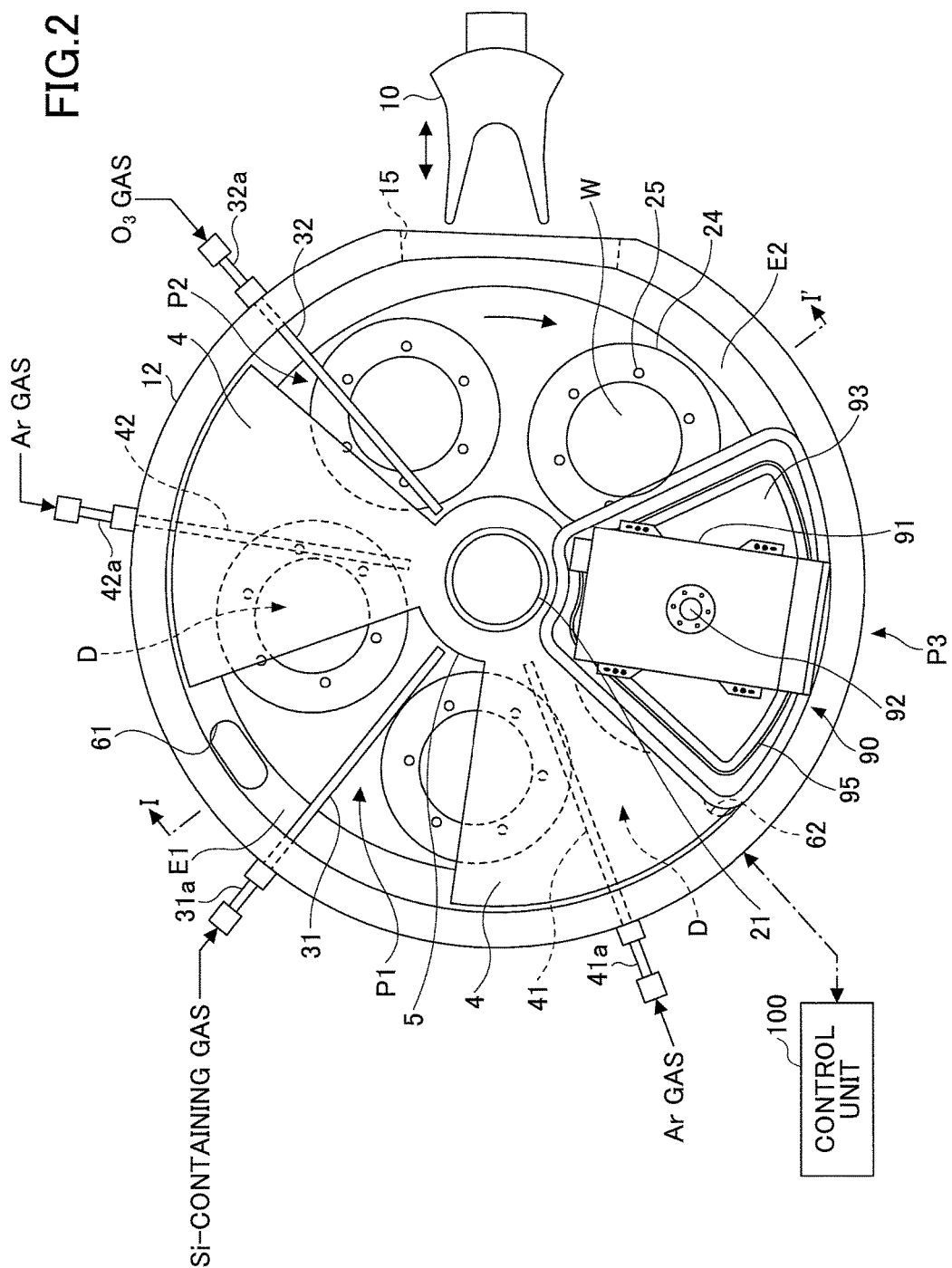
FIG. 2 is a schematic plan view of a substrate processing apparatus according to an embodiment of the present invention.
Figure 3:
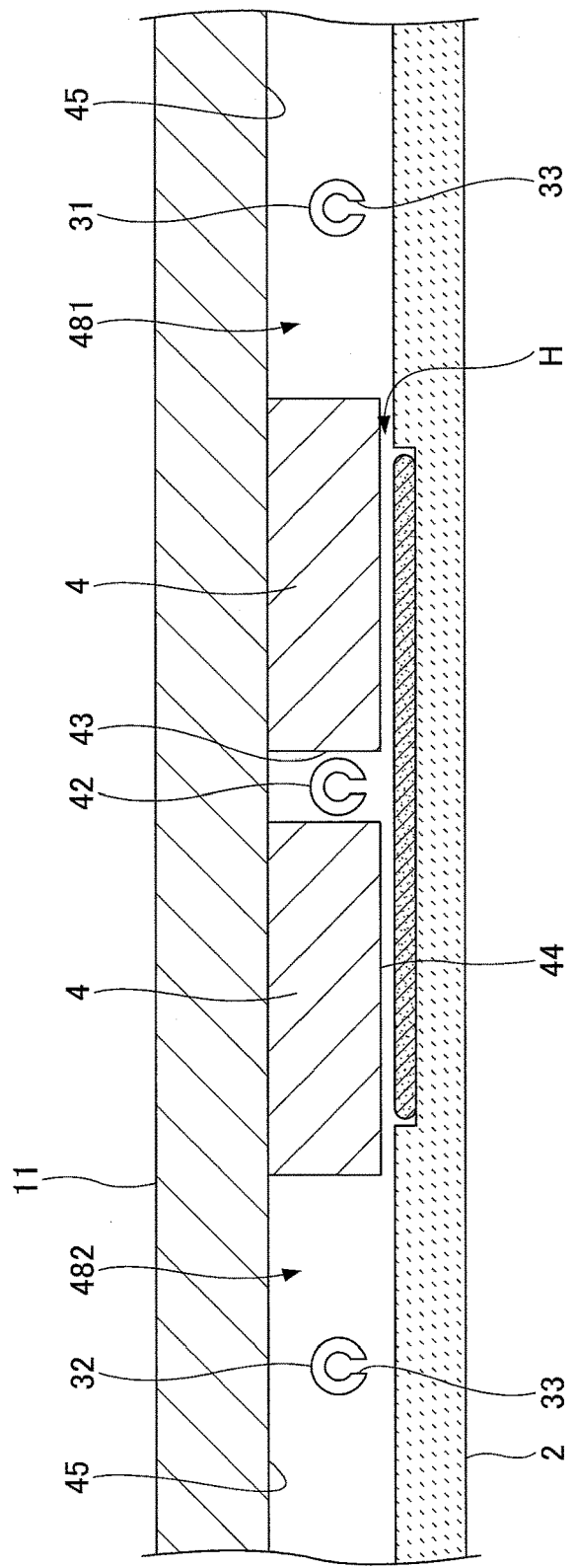
FIG. 3 is a partial cross-sectional view for explaining a separation region in a substrate processing apparatus according to an embodiment of the present invention.
Figure 4:
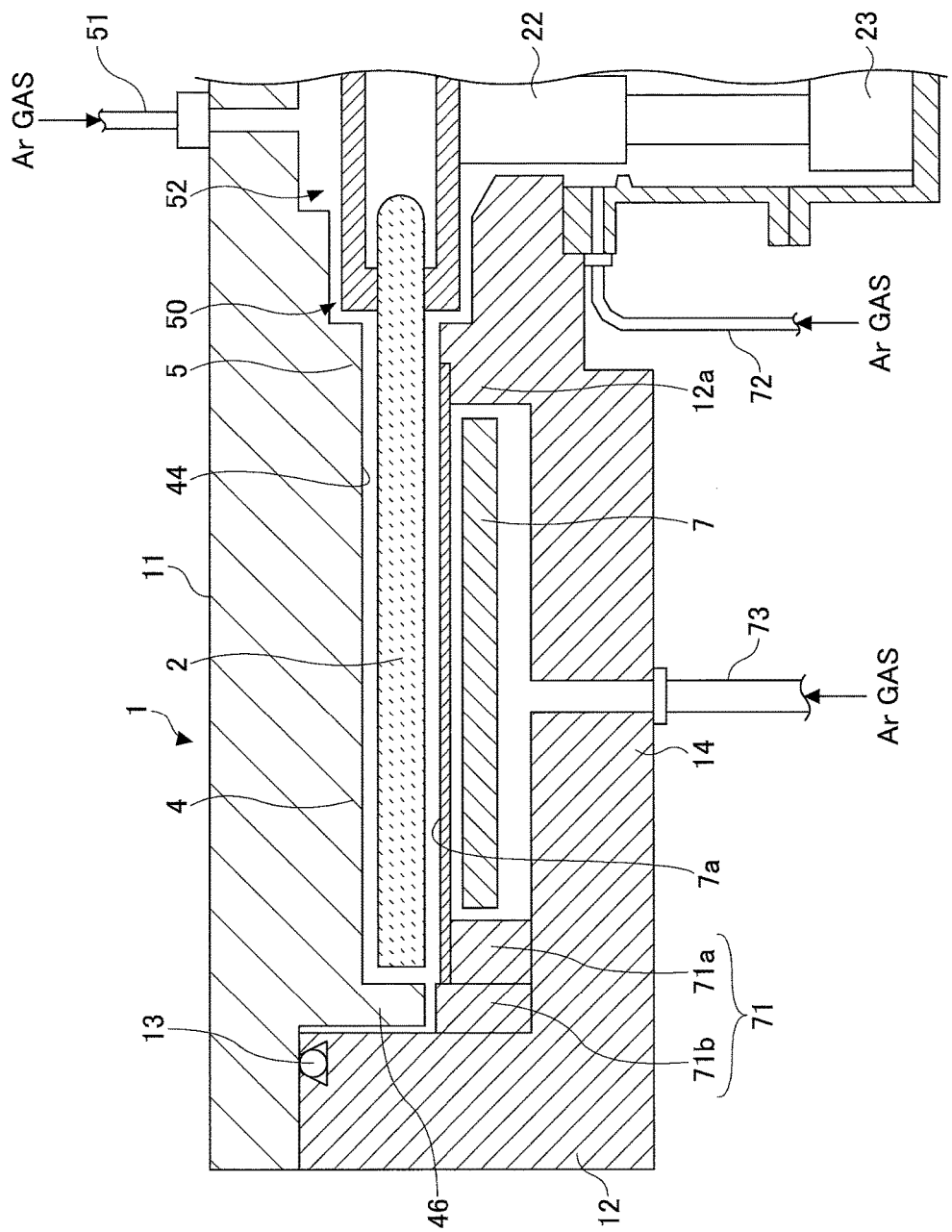
FIG. 4 is another partial cross-sectional view of a substrate processing apparatus according to an embodiment of the present invention.

A substrate processing apparatus according to a first embodiment of the present invention is described below. FIG. 1 is a schematic cross-sectional view of the substrate processing apparatus according to the first embodiment of the present invention. FIG. 2 is a schematic plan view of the substrate processing apparatus according to the first embodiment of the present invention. FIG. 3 is a partial cross-sectional view for explaining a separation region of the substrate processing apparatus according to the first embodiment of the present invention. FIG. 4 is another partial cross-sectional view of the substrate processing apparatus according to the first embodiment of the present invention.

As illustrated in FIGS. 1 and 2, the substrate processing apparatus according to the embodiment of the present invention includes a vacuum chamber 1 having a substantially circular planar shape, and a turntable 2 that is arranged within the vacuum chamber 1 so that the center of the vacuum chamber 1 corresponds to the rotational center of the turntable 2.

The vacuum chamber 1 is a process chamber to process a wafer W while accommodating the wafer W. The vacuum chamber 1 includes a chamber body 12 having a cylindrical shape with a bottom, and a ceiling plate 11 that is detachably arranged on an upper surface of the chamber body 12 and is sealed airtight to the upper surface via a sealing member 13 such as an O-ring.

The turntable 2 has a center portion that is fixed to a cylindrical core portion 21. The core portion 21 is fixed to an upper end of a rotary shaft 22 extending in the vertical direction. The rotary shaft 22 penetrates through a bottom portion 14 of the vacuum chamber 1 and has a lower end that is attached to a drive unit 23 for rotating the rotary shaft 22 around a vertical axis. The rotary shaft 22 and the drive unit 23 are accommodated in a cylindrical case 20 having an opening formed at its upper face. The case 20 has a flange portion formed at its upper face that is attached airtight to a bottom surface of the bottom portion 14 of the vacuum chamber 1, and in this way, an internal atmosphere within the case 20 may be maintained airtight from an external atmosphere of the case 20.

As illustrated in FIG. 2, a plurality (e.g., five in the illustrated example) of circular concave portions 24 that are capable of accommodating a plurality of semiconductor wafers (hereinafter referred to as "wafers W") are arranged along a rotational direction (circumferential direction) on the surface of the turntable 2. The wafers W are an example of substrates, and a variety of substrates other than the semiconductor wafer can be used. The concave portion 24 has an inner diameter that is sufficiently larger than the diameter of the wafer W such that the wafer W can be placed on the concave portion 24 without touching the inner circumferential surface of the concave portion 24. A plurality of pins 25 for holding the wafer W is provided in the bottom surface of the concave portion 24. Because an area of the concave portion 24 is sufficiently larger than an area of the wafer W, when the turntable 2 rotates, the wafer W flies out of the concave portion 24 without being held by the inner surface of the concave portion 24. Hence, the wafer W is held by the pins 25 for holding the wafer W. Accordingly, at least three pins 25 are provided apart from each other along the outer circumference of the wafer W so as to be able to hold the wafer W by acting against the centrifugal force acting on the wafer W when the turntable 2 rotates. In the examples in FIGS. 2 and 3, six pins 25 are arranged at an equal distance along the outer circumference of the wafer W so as to equally divide the outer circumference of the wafer W into six. The pins 25 are provided at positions apart from the inner circumferential surface of the concave portion 24, and may be provided at any positions depending on the intended use as long as the pins 25 are apart from the inner circumferential surface. For example, the pins 25 may be symmetrically provided about the center of the concave portion 24 so that all of the pins 25 are at the same distance from the inner circumferential surface of the concave portion 24.

Moreover, each of the concave portions 24 has a depth that is approximately equal to the thickness of the wafer W. Accordingly, when the wafer W is placed in the concave portion 24, the surface of the wafer W and the surface of the turntable 2 (i.e., surface of the region where the wafer W is not placed) may be substantially flush. Also, through holes 29 (see FIG. 17) are formed in a bottom surface of the concave portion 24 so as to allow, for example, three lift pins for supporting the back surface of the wafer W and lifting and lowering the wafer W to penetrate through the through holes 29.

Thus, the concave portions 24 and the pins 25 constitute a substrate holding part of the substrate processing apparatus according to the first embodiment of the present invention. Details of configurations and functions of the concave portions 24 and the pins 25 are described later, and the overall of the substrate processing apparatus is subsequently described below.

Also, as illustrated in FIG. 2, process gas nozzles 31 and 32, separation gas nozzles 41 and 42, and an etching gas supply unit 90 are arranged above the turntable 2. In the illustrated example, the etching gas supply unit 90, the separation gas nozzle 41, the process gas nozzle 31, the separation gas nozzle 42, and the process gas nozzle 32 are spaced apart along the circumferential direction of the vacuum chamber 1 in the recited order as viewed clockwise (rotational direction of the turntable 2) from a transfer opening 15 (described below). Note that the process gas nozzle 31 is an example of a first process gas supply unit, and the process gas nozzle 32 is an example of a second process gas supply unit.

In the present embodiment, an example in which the substrate processing apparatus includes not only a an etching region but also a film deposition region is described, but the substrate processing apparatus may be configured as an etching apparatus including only the etching gas supply unit 90 provided in the etching region or only the etching gas supply unit 90 and the separation gas nozzle 41 and 42 without the process gas nozzles 31 and 32 to be provided in the film deposition region. However, in the following embodiments, examples of the substrate processing apparatus including both of the etching region and the film deposition region are described hereinafter.

The process gas nozzles 31 and 32 respectively include gas introduction ports 31a and 32a corresponding to base portions that are fixed to an outer peripheral wall of the chamber body 12. The process gas nozzles 31 and 32 are introduced into the vacuum chamber 1 from the outer peripheral wall of the vacuum chamber 1. Also, the process gas nozzles 31 and 32 are arranged to extend parallel with respect to the turntable 2 along the radial directions of the chamber body 12.

The separation gas nozzles 41 and 42 respectively include gas introduction ports 41a and 42a corresponding to base portions that are fixed to the outer peripheral wall of the chamber body 12. The separation gas nozzles 41 and 42 are introduced into the vacuum chamber 1 from the outer peripheral wall of the vacuum chamber 1. The separation gas nozzles 41 and 42 are arranged to extend parallel with respect to the turntable 2 along the radial directions of the chamber body 12.

Note that details of the etching gas supply unit 90 are described below.

The process gas nozzle 31 may be made of quartz, for example, and is connected to a supply source of a Si (silicon)-containing gas that is used as a first process gas via a pipe and a flow regulator (not shown), for example. The process gas nozzle 32 may be made of quartz, for example, and is connected to a supply source of an oxidizing gas that is used as a second process gas via a pipe and a flow regulator (not shown), for example. The separation gas nozzles 41 and 42 are each connected to supply sources of separation gases via a pipe and a flow rate regulating valve (not shown), for example.

Note that organic amino silane gas may be used as the Si-containing gas, and $O_3$ (ozone) gas or $O_2$ (oxygen) gas may be used as the oxidizing gas, for example. Also, $N_2$ (nitrogen) gas and Ar (argon) gas may be used as the separation gases, for example.

The process gas nozzles 31 and 32 have a plurality of gas discharge holes 33 that open toward the turntable 2 (see FIG. 3). The gas discharge holes 33 may be arranged at intervals of 10 mm, for example, along the length direction of the process gas nozzles 31 and 32, for example. As illustrated in FIG. 2, a region below the process gas nozzle 31 corresponds to a first process region P1 for causing adsorption of the Si-containing gas to the wafer W. A region below the process gas nozzle 32 corresponds to a second process region P2 for oxidizing the Si-containing gas that has been adsorbed to the wafer W at the first process region P1. Also, a region below the etching gas supply unit 90 corresponds to a third process region P3 to supply an etching gas for etching a reaction product deposited on the wafer W.

Here, because the first process region P1 is a region provided to supply a source gas to the wafer W, the first process region P1 may be referred to as a source gas supply region P1. Because the second process region P2 is an area provided to supply a reaction gas that can produce a reaction product by reacting with the source gas to the wafer W, the second process region P2 may be referred to as a reaction gas supply region P2. Also, because the third process region P3 is a region provided to perform an etching process on the wafer W, the third process area P3 may be referred to as an etching region P3.

As illustrated in FIGS. 2 and 3, convex portions 4 protruding toward the turntable 2 from bottom surfaces of the ceiling plate 11 are provided in the vacuum chamber 1. The convex portions 4 and the separation gas nozzles 41 and 42 form separation regions D. The convex portion 4 is fan-shaped in planar view and has a tip that is cut into a circular arc shape. In the present embodiment, the inner arc of the convex portion 4 is connected to a protruding portion 5 (described below) and the outer arc of the convex portion 4 is arranged along an inner circumferential surface of the chamber body 12 of the vacuum chamber 1.

FIG. 3 is a partial cross-sectional view of the vacuum chamber 1 along a concentric circle to the outer circumference of the turntable 2 from the process gas nozzle 31 to the process gas nozzle 32. As illustrated in FIG. 3, the vacuum chamber 1 includes a first ceiling surface 44 corresponding to the bottom surface of the convex portion 4 that is low and flat, and a second ceiling surface 45 that is higher than the first ceiling surface 44 and is arranged at both sides of the first ceiling surface 44 in the circumferential direction.

As illustrated in FIG. 2, the first ceiling surface 44 is fan-shaped in planar view and has a tip that is cut into an arc shape. Also, as illustrated in FIG. 3, a groove portion 43 extending in a radial direction is formed at the center of the convex portion 4 in the circumferential direction, and the separation gas nozzle 42 is accommodated within this groove portion 43. Note that another groove portion 43 is similarly formed in the other convex portion 4, and the separation gas nozzle 41 is accommodated within the groove portion 43. Also, the process gas nozzles 31 and 32 are arranged in spaces below the higher second ceiling surface 45. The process gas nozzles 31 and 32 are spaced apart from the second ceiling surface 45 to be arranged close to the wafer W. As illustrated in FIG. 3, the process gas nozzle 31 is arranged is provided on the right side in a space 481 under the higher ceiling surface 45 when seen from the outer circumferential side of the turntable 2, and the process gas nozzle 32 is provided on the left side in a space 482 under the higher ceiling surface 45.

The first ceiling surface 44 forms a separation space H that is a narrow space between the first ceiling surface 44 and the surface of the turntable 2. The separation space H can separate the Si-containing gas supplied from the first region P1 and the oxidizing gas supplied from the second area P2 from each other. Specifically, when Ar gas is discharged from the separation gas nozzle 42, Ar gas discharged from the separation gas nozzle 42 flows toward the space 481 and the space 482 through the separation space H. At this time, because Ar gas flows through the narrow separation space H that has a volume smaller than the spaces 481 and 482, the pressure in the separation space H can be made higher than the pressure in the spaces 481 and 482. That is, a pressure barrier may be created between the spaces 481 and 482. Also, Ar gas flowing from the separation space H into the spaces 481 and 482 acts as a counter flow against the flow of the Si-containing gas from the first area P1 and the flow of the oxidizing gas from the second area P2. Thus, the Si-containing gas and the oxidizing gas may be substantially prevented from flowing into the separation space H. In this way, the Si-containing gas and the oxidizing gas are prevented from mixing and reacting with each other in the vacuum chamber 1.

In the meantime, as illustrated in FIG. 2, the protruding portion 5 is arranged around the outer periphery of the core portion 21 that fixes the turntable 2, and the protruding portion 5 is arranged on the bottom surface of the ceiling plate 11. In the present embodiment, the protruding portion 5 is connected to a portion on the rotational center side of the convex portion 4, and a bottom surface of the protruding portion 5 is arranged to be flush with the first ceiling surface 44.

Note that for convenience of explanation, FIG. 2 illustrates a cross-section of the chamber body 12 cut along a position that is higher than the second ceiling surface 45 and lower than the separation gas nozzles 41 and 42.

FIG. 1, referred to above, is a cross-sectional view of the substrate processing apparatus along line I-I' of FIG. 2 illustrating a region where the second ceiling surface 45 is arranged. On the other hand, FIG. 4 is a partial cross-sectional view of the substrate processing apparatus illustrating a region where the first ceiling surface 44 is arranged.

As illustrated in FIG. 4, a bent portion 46 that is bent into an L-shape to face an outer edge surface of the turntable 2 is formed at a peripheral portion (portion toward the outer edge of the vacuum chamber 1) of the fan-shaped convex portion 4. The bent portion 46, like the convex portion 4, prevents the two reaction gases from entering the separation space H from both sides of the separation region D and prevents the two reaction gases from mixing with each other. The fan-shaped convex portion 4 is arranged at the ceiling plate 11, and the ceiling plate 11 is arranged to be detachable from the chamber body 12. Thus, a slight gap is formed between an outer peripheral surface of the bent portion 46 and the chamber body 12. Note that dimensions of a gap between an inner peripheral surface of the bent portion 46 and an outer edge surface of the turntable 2, and the gap between the outer peripheral surface of the bent portion 46 and the chamber body 12 may be substantially the same as the height dimension of the first ceiling surface 44 with respect to the surface of the turntable 2, for example.

In the separation area D, an inner peripheral wall of the chamber body 12 is arranged into a substantially vertical plane that is in close proximity with the outer peripheral surface of the bent portion 46 as illustrated in FIG. 4. Note, however, that in regions other than the separation area D, the inner peripheral wall of the chamber body 12 may have a portion recessed toward a region facing the outer edge surface of the turntable 12 to the bottom portion 14 as illustrated in FIG. 1, for example. In the following, for convenience of explanation, such a recessed portion having a rectangular cross section is referred to as "exhaust region E". More specifically, the exhaust region E that communicates with the first process area P1 is referred to as "first exhaust region E1", and the exhaust region E that communicates with the second process area P2 is referred to as "second exhaust region E2" as illustrated in FIG. 2. Further, a first exhaust port 61 and a second exhaust port 62 are respectively formed at the bottom of the first exhaust region E1 and the second exhaust region E2. As illustrated in FIG. 1, the first exhaust port 61 and the second exhaust port 62 are each connected to an evacuation unit such as a vacuum pump 64 via an exhaust pipe 63. Also, a pressure regulating unit 65 is arranged at the exhaust pipe 63.

As illustrated in FIGS. 1 and 4, a heater unit 7 as a heating unit can be arranged in a space between the turntable 2 and the bottom portion 14 of the vacuum chamber 1, and a wafer W arranged on the turntable 2 can be heated to a predetermined temperature according to a process recipe via the turntable 2. Also, a ring-shaped cover member 71 for preventing gas from entering an area under the turntable 2 is arranged at a lower side of a peripheral edge portion of the turntable 2. The cover member 71 acts as a partition member for separating the atmosphere of a region extending from the space above the turntable 2 to the exhaust regions E1 and E2 and the atmosphere of a space where the heater unit 7 is arranged.

The cover member 71 includes an inner member 71a that is arranged to face an outer edge portion of the turntable 2 and a portion extending further outward from this outer edge portion from the lower side, and an outer member 71b that is arranged between the inner member 71a and an inner wall surface of the vacuum chamber 1. In the separation area D, the outer member 71b is arranged near the bent portion 46, at the lower side of the bent portion 46, which is formed at the outer edge portion of the convex portion 4. The inner member 71a is arranged to surround the entire periphery of the heater unit 7 at the lower side of the outer edge portion of the turntable 2 (and the portion extending slightly outward from the outer edge portion).

A protrusion 12a is formed at a part of the bottom portion 14 toward the rotational center of the space where the heater unit 7 is disposed. The protrusion 12a protrudes upward to approach the core portion 21 at a center portion of the bottom surface of the turntable 2. A narrow space is formed between the protrusion 12a and the core portion 21. Also, a narrow space is provided between an outer peripheral face of the rotary shaft 22 that penetrates through the bottom portion 14 and the inner peripheral surface of a through hole for the rotary shaft 22. Such narrow spaces are arranged to be in communication with the case 20. Further, a purge gas supply pipe 72 for supplying Ar gas as a purge gas is arranged at the case 20.

Also, a plurality of purge gas supply pipes 73 for purging the space accommodating the heater unit 7 are arranged at the bottom portion 14 of the vacuum chamber 1 at intervals of a predetermined angle along the circumferential direction below the heater unit 7 (only one of the purge gas supply pipes 73 is illustrated in FIG. 4). Also, a lid member 7a is arranged between the heater unit 7 and the turntable 2 in order to prevent gas from entering the region where the heater unit 7 is located. The lid member 7a is arranged to extend in the circumferential direction to cover a region between an inner wall of the outer member 71b (upper face of the inner member 71a) and an upper edge portion of the protrusion 12a. The lid member 7a may be made of quartz, for example.

Also, a separation gas supply pipe 51 is connected to a center portion of the ceiling plate 11 of the vacuum chamber 1. The separation gas supply pipe 51 is configured to supply Ar gas as a separation gas to a space 52 between the ceiling plate 11 and the core portion 21. The separation gas supplied to the space 52 is discharged toward the periphery of the turntable 2 along a surface on the wafer receiving region side of the turntable 2 via a narrow space 50 between the protruding portion 5 and the turntable 2. The pressure within the space 50 can be maintained at a higher pressure than the pressure within the space 481 and the space 482 by the separation gas. That is, by providing the space 50, the Si-containing gas supplied to the first process region P1 and the oxidizing gas supplied to the second process region P2 may be prevented from passing through a center region C (see FIG. 1) to mix with each other. In other words, the space 50 (or the center region C) may have a function similar to that of the separation space H (or separation area D).

Further, as illustrated in FIG. 2, the transfer opening 15 for transferring the wafer W corresponding to a substrate between an external transfer arm 10 and the turntable 2 is arranged at a side wall of the vacuum chamber 1. The transfer opening 15 may be opened/closed by a gate valve (not illustrated). Note that the wafer W may be transferred back and forth between the concave portion 24 corresponding to the wafer receiving region of the turntable 2 and the transfer arm 10 when the concave portion 24 is positioned to face the transfer opening 15. Accordingly, lift pins that penetrate through the concave portion 24 to lift the wafer W from its back surface and a lift mechanism for the lift pins (not illustrated) are arranged at a portion below the turntable 2 corresponding to a transfer position for transferring the wafer W.

Figure 5:
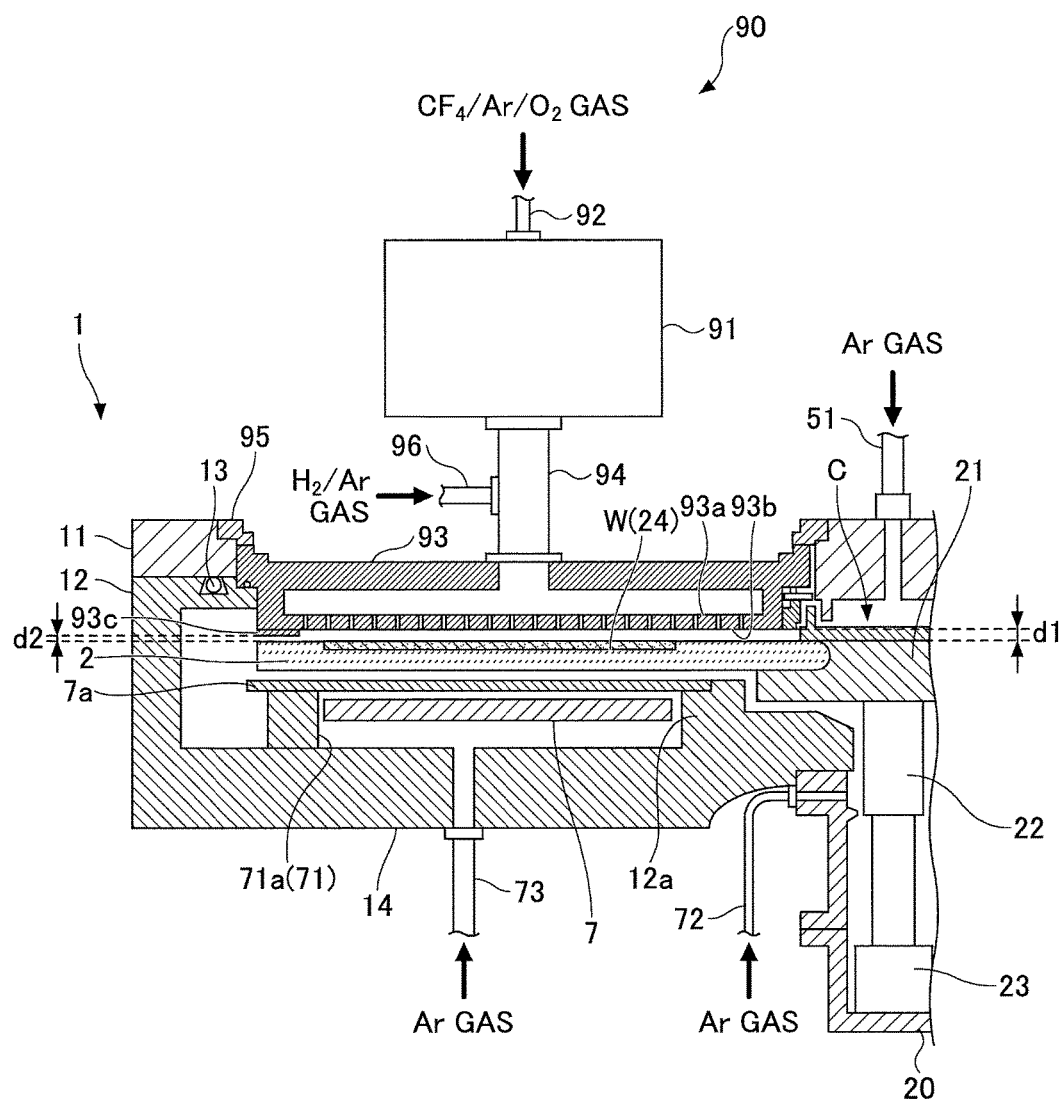
FIG. 5 is a partial cross-sectional view illustrating a third process region P3 of a substrate processing apparatus according to an embodiment of the present invention.

In the following, the etching gas supply unit 90 is described with reference to FIGS. 2, 5 and 6. FIG. 5 is a partial cross-sectional view illustrating a third process region P3 of the substrate processing apparatus according to the first embodiment of the present invention.

The etching gas supply unit 90 is provided so as to face the turntable 2 in the third process region (etching region) P3. The etching gas supply unit 90 supplies an activated fluorine-containing gas to a film deposited on the wafer W, thereby etching the film. As illustrated in FIGS. 2 and 5, the etching gas supply unit 90 includes a plasma generation unit 91, an etching gas supply pipe 92, a shower head unit 93, a pipe 94, and a hydrogen-containing gas supply unit 96. Note that the shower head unit 93 is an example of an etching gas discharging unit. Hence, for example, an etching gas nozzle may be used instead of the shower head unit 93.

The plasma generation unit 91 activates a fluorine-containing gas supplied from the etching gas supply pipe 92 using a plasma source. The plasma source is not particularly limited as long as it is capable of activating the fluorine-containing gas to generate F (fluorine) radicals. For example, an inductively coupled plasma (ICP), a capacitively coupled plasma (CCP), or a surface wave plasma (SWP) may be used as the plasma source.

The etching gas supply pipe 92 has one end that is connected to the plasma generation unit 91 to supply the fluorine-containing gas to the plasma generation unit 91. The other end of the etching gas supply pipe 92 may be connected to an etching gas supply source that stores the fluorine-containing gas via an on-off valve and a flow regulator, for example. Note that a variety of fluorine-containing gases are available for the fluorine-containing gas as long as the fluorine-containing gas can etch the film deposited on the wafer W. Specifically, for example, fluorine-containing gases including hydrofluorocarbons such as $CHF_3$ (trifluoromethane), fluorocarbons such as $CF_4$ (carbon tetrafluoride) for etching a silicon oxide film may be used. Further, gases such as Ar gas and/or $O_2$ gas may be added to these fluorine-containing gases at appropriate amounts, for example.

The shower head unit 93 is connected to the plasma generation unit 91 via the pipe 94. The shower head unit 93 supplies the fluorine-containing gas that has been activated by the plasma generation unit 91 into the vacuum chamber 1. The shower head unit 93 is fan-shaped in planar view and is pressed downward along the circumferential direction by a press member 95 that is formed along the outer edge of the fan shape. The press member 95 is fixed to the ceiling plate 11 by a bolt or the like (not illustrated), and in this way, the internal atmosphere of the vacuum chamber 1 may be maintained airtight. The distance between a bottom surface of the shower head unit 93 when it is secured to the ceiling plate 11 and a surface of the turntable 2 may be arranged to be about 0.5 mm to about 5 mm, for example. A region below the shower head unit 93 corresponds to the third process region P3 for etching a silicon oxide film, for example. In this way, F radicals contained in the activated fluorine-containing gas that is supplied into the vacuum chamber 1 via the shower head unit 93 may efficiently react with the film deposited on the wafer W.

A plurality of gas discharge holes 93a are arranged at the shower head unit 93. In view of the difference in angular velocity of the turntable 2, fewer gas discharge holes 93a are arranged at a rotational center side of the shower head unit 93, and more gas discharge holes 93a are arranged at an outer peripheral side of the shower head unit 93. The total number of the gas discharge holes 93a may be several tens to several hundreds, for example. Also, the diameter of the plurality of gas discharge holes 93a may be about 0.5 mm to 3 mm, for example. The activated fluorine-containing gas supplied to the shower head unit 93 may be supplied to the space between the turntable 2 and the shower head unit 93 via the gas discharge holes 93a.

However, even when more gas discharge holes 93a are arranged at the outer peripheral side, the etching rate is likely to significantly decrease at the outer peripheral side than at the rotational center side, and the decrease in etching rate cannot be efficiently prevented by just increasing a ratio of the gas discharge holes 93a at the outer peripheral side to the gas discharge holes 93a at the rotational center side in many cases. In general, in a film deposition process, by increasing the density of gas discharge holes in a predetermined area and a supply rate of a gas, a deposition rate in the predetermined area can be increased. However, in the etching process, even when the supply rate of the etching gas is increased, the etching rate does not necessarily increase in many cases. Although the reason will be described later by using experimental data, it is conceivable that this is because a rate-limiting factor of the etching process is not a supply amount of the etching gas but whether or not the reaction occurs. In other words, even if sufficient etching gas is supplied, when conditions of the etching reaction are not satisfied, a sufficient etching rate cannot be achieved. The conditions of the etching reaction mean a state of having sufficient etching reaction energy, and the etching reaction energy can be kept high under high pressure and high temperature.

Hence, the substrate processing apparatus according to the present embodiment is configured to include a downward protruding surface 93c that protrudes downward on the outer peripheral portion so as to prevent a decrease in pressure at the outer peripheral portion inside the etching region P3. The downward protruding surface 93c is provided outside the concave portions 24 of the turntable 2 so as to face the surface of the turntable 2 at the outer peripheral portion. The downward protruding surface 93c forms a gap d2 that is narrower than a gap d1 between an inner area of a lower surface 93b of the shower head unit 93 and the surface of the turntable 2 at the outer peripheral portion, thereby preventing the etching gas discharged from the gas discharge holes 93a from going outward. In addition, the downward protruding surface 93c prevents decrease in the pressure and the etching reaction energy at the outer peripheral portion of the etching region P3. This prevents the etching rate at the outer peripheral portion of the etching region P3 from decreasing, and allows a uniform etching rate to be obtained as a whole across the etching region P3.

Here, the outer peripheral portion of the turntable 2 may be configured to be larger than the usual turntable 2 so as to sufficiently ensure the area of the narrow gap d2 formed between the downward protruding surface 93c and the surface of the turntable 2 in the radial direction. In other words, the diameter of the turntable 2 may be configured to be larger by expanding the area outside the concave portions 24 of the turntable 2 outward. This is because the effect of preventing the outflow of the etching gas and increasing the pressure on the peripheral side cannot be sufficiently obtained even when the clearance or gap forming the narrow gap d2 is provided if the length of the narrow gap d2 is too short in the radial direction. In FIG. 5, an example of slightly expanding the outer peripheral portion of the turntable 2 is illustrated.

Moreover, the gap d1 between the inner lower surface 93b of the shower head unit 93 and the turntable 2, and the narrow gap d2 between the downward protruding surface 83c and the surface of the turntable 2 can be set at a variety of values depending on intended use as long as the values satisfy 0<d2<d1.

Furthermore, the downward protruding surface 93c may be formed by attaching a plate-shaped member to the flat lower surface of the shower head unit 93, or the shower head unit 93 may be formed as a single integral component by processing the shower head unit 93 into a shape with the downward protruding surface 93c from the beginning.

Figure 6:
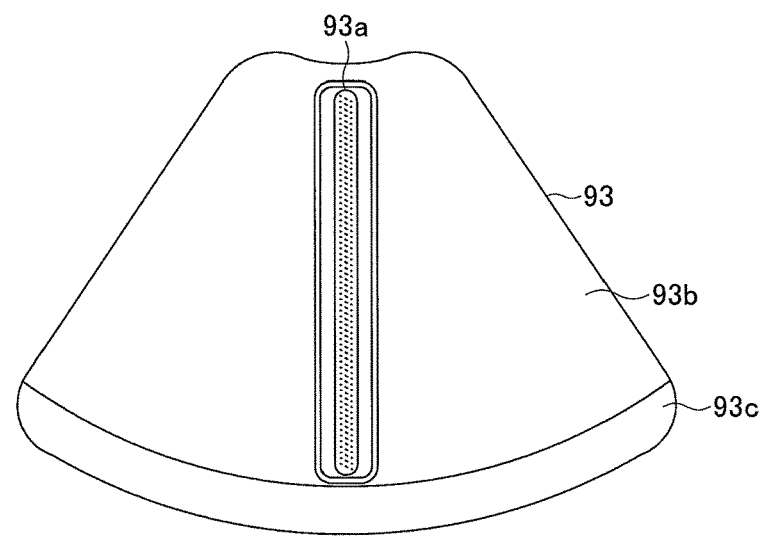
FIG. 6 is a plan view illustrating an example of a lower surface of a shower head unit of a substrate processing apparatus according to an embodiment of the present invention.

FIG. 6 is a plan view illustrating an example of a lower surface of the shower head unit 93. As illustrated in FIG. 6, the downward protruding surface 93c may be provided in a belt-like form along the outer circumference of the lower surface 93c of the fan-shaped shower head unit 93. This can uniformly prevent the pressure on the outer peripheral side of the etching region P3 from decreasing in the circumferential direction. Moreover, the gas discharge holes 93a may be provided at the center of the lower surface 93b of the shower head unit 93 in the circumferential direction so as to extend in the radial direction. Thus, the etching gas can be supplied in a dispersed manner from the central side throughout the outer peripheral side of the turntable 2.

Components in FIG. 5 are described below again. The pipe 94 is arranged upstream of the shower head unit 93 and connects the plasma generation unit 91 with the shower head unit 93. The hydrogen-containing gas supply unit 96 is arranged at an outer peripheral side of the pipe 94 with respect to the radial direction of the turntable 2.

The hydrogen-containing gas supply unit 96 has one end that is connected to the pipe 94 and is configured to supply a hydrogen-containing gas into the pipe 94. The other end of the hydrogen-containing gas supply unit 96 may be connected to a hydrogen-containing gas supply source via a switching valve and a flow regulator, for example.

Note that a gas mixture of $H_2$ (hydrogen) gas and Ar gas (hereinafter referred to as "$H_2$/Ar gas") may be used as the hydrogen-containing gas, for example. Also, the supply flow rate of $H_2$ gas may be controlled to be greater than or equal to 1 sccm and less than or equal to 50 sccm, for example, and the supply flow rate of the Ar gas may be controlled to be greater than or equal to 500 sccm and less than or equal to 10 slm, for example.

Note that in the example of FIG. 5, one hydrogen-containing gas supply unit 96 is arranged at an outer peripheral side of the pipe 94 with respect to a radial direction of the turntable 2. However, the present invention is not limited to such an arrangement. For example, the hydrogen-containing gas supply unit 96 may be arranged ahead of the pipe 94 or behind the pipe 94 with respect to the rotational direction of the turntable 2. Also, in some examples, a plurality of the hydrogen-containing gas supply units 96 may be arranged at the pipe 94.

Further, as illustrated in FIG. 1, the substrate processing apparatus includes a control unit 100 configured by a computer for performing control operations of the substrate processing apparatus. The control unit 100 includes a memory storing a program for causing the substrate processing apparatus to implement a substrate processing method according to an embodiment of the present invention under control of the control unit 100 as described below. The program includes a set of steps for implementing operations of the substrate processing apparatus as described below and may be installed in the control unit 100 from a storage unit 100 that may be configured by a hard disk, a compact disk, a magnetic optical disk, a memory card, a flexible disk, or some other type of computer-readable storage medium.

Next, the concave portion 24 and the pins 25 constituting the substrate holding part of the substrate processing apparatus according to the first embodiment of the present invention are described below in more detail with reference to experimental results.

Figure 7:
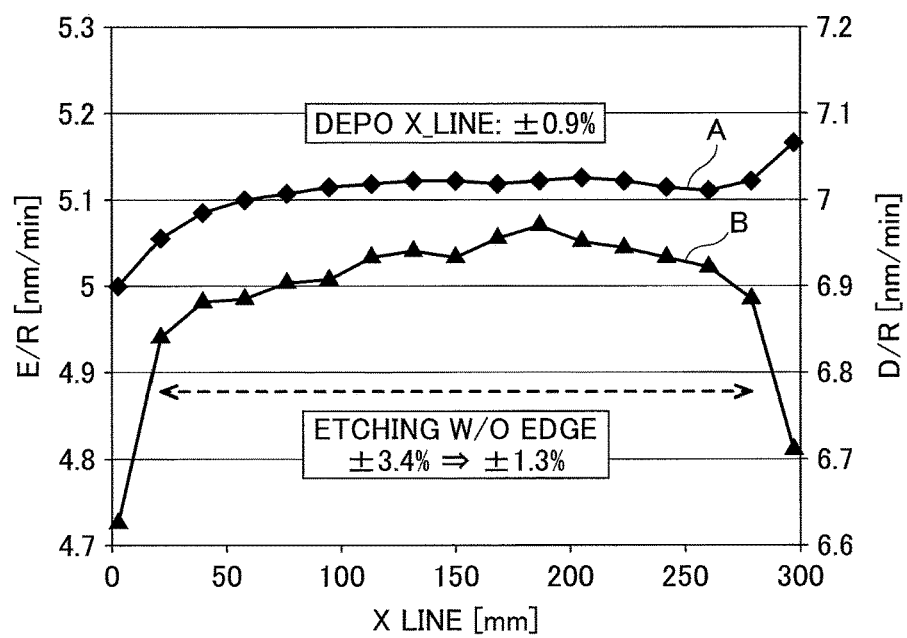
FIG. 7 is a graph showing an experimental result when a conventional substrate processing apparatus performed a film deposition process and an etching process on a wafer on an entire surface of which a uniform film is formed.

FIG. 7 is a graph showing an experimental result when a conventional substrate processing apparatus deposited a homogeneous film on an entire surface of a wafer W and etched the deposited film.

In FIG. 7, a deposition rate and an etching rate in an X direction along the circumferential direction of the turntable 2 are shown. Here, in FIG. 7, the horizontal axis shows a coordinate of the wafer W in the X direction, and the vertical axis shows the deposition rate and the etching rate (nm/min, both).

Moreover, the etching conditions were set as follows: a pressure in the vacuum chamber 1 was set at 1.3 Torr; a rotational speed of the turntable was set at 60 rpm; and flow rates of $Ar/CF_4/O_2$ were set at 5000/10/100 sccm. Furthermore, flow rates of $H_2/H_2$—Ar were set at 0/2000 sccm.

As illustrated in FIG. 7, a curve A showing the deposition rate is approximately uniform throughout the all coordinates, and indicates that preferable uniformity across the surface of the wafer W was obtained. In contrast, a curve B showing the etching rate significantly decreased on both edges compared to the central area. Thus, the experimental result indicated that the etching rates at the edges of the wafer W widely decreased.

Figure 8:
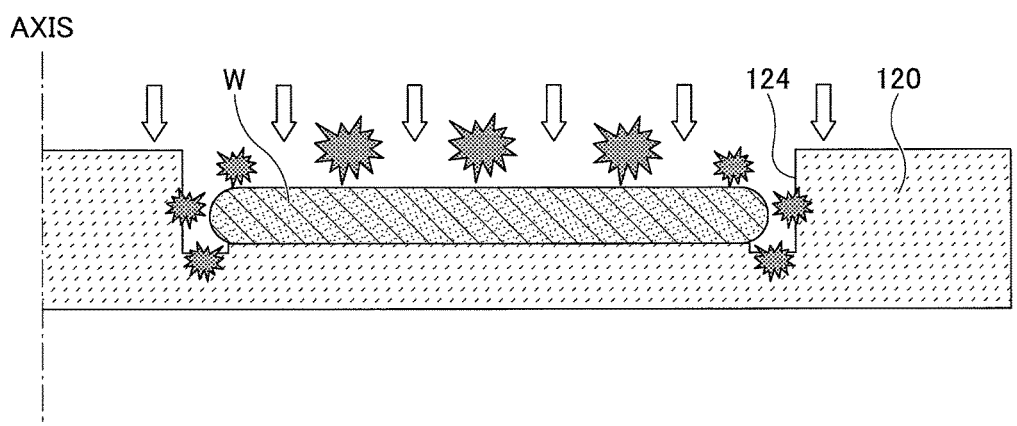
FIG. 8 is a cross-sectional view illustrating a positional relationship between a concave portion of a turntable of conventional substrate processing apparatus and a wafer W.

FIG. 8 is a cross-sectional view illustrating a positional relationship between a turntable 120 of the conventional substrate processing apparatus and a concave portion 124. As illustrated in FIG. 8, because the concave portion 124 of the conventional substrate processing apparatus has a function of holding a lateral side of the wafer W, the inner circumferential surface is close to the edge of the wafer W. In this case, while an etching gas is supplied only to the surface of the wafer W at the central portion, the etching gas is supplied not only to the edge surface but also to the bottom surface and the inner circumferential surface of the wafer W at the edge portion. Thus, the etching gas is consumed in the etching of the bottom surface and the inner circumferential surface of the concave portion as well as the etching of the edge surface due to a loading effect of the etching gas. Because the flow rate of the etching gas is constant without respect to the position of the wafer W, while all of the etching gas is utilized to etch the film at the central portion, the etching gas is vainly consumed in the bottom surface and the inner surface of the concave portion 24 at the edge portion, and the amount of etching gas used for etching the edge portion of the wafer W decreases. Because of the loading phenomenon, as shown by FIG. 7, the etching rate at edge portions of the wafer W more widely decreases than at the central portion.

Figure 9:
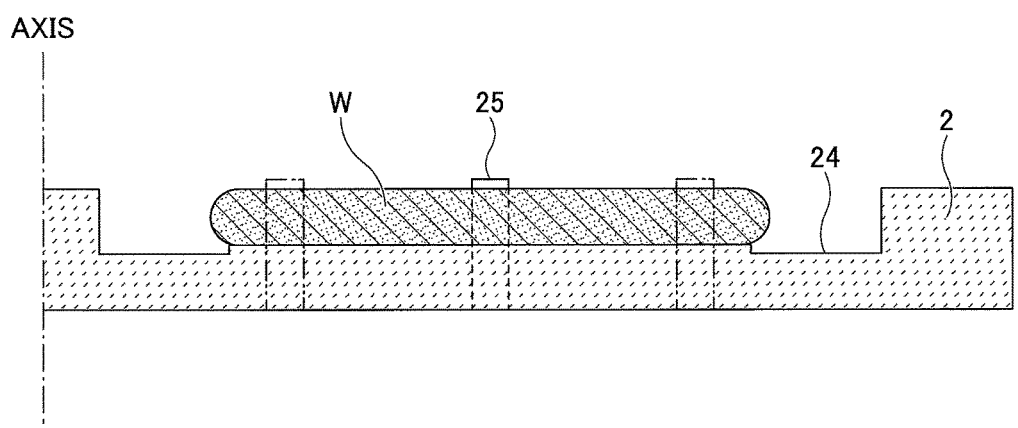
FIG. 9 is a diagram illustrating a positional relationship between a concave portion of a turntable of a substrate processing apparatus according to an embodiment of the present invention and a wafer W.

FIG. 9 is a diagram illustrating an example of a positional relationship between the concave portion 24 of the turntable 2 according to the first embodiment of the present invention and a wafer W.

As illustrated in FIG. 9, the inner diameter of the concave portion 24 is sufficiently greater than the outer diameter of the wafer W, and a relatively long distance is kept between the inner circumferential surface of the concave portion 24 and the lateral surface of the wafer W. The wafer W is held at the central position of the concave portion 24 by the pins 25. When the etching is performed in this state, because the edge of the wafer w is far distant from the inner circumferential surface of the concave portion 24, the etching is hardly affected by the lading effect, the etching rate of the edge portion can be achieved at the same level as the etching rate of the central portion. Thus, the uniformity of the etching rate of the film on the wafer W across the surface of the wafer W can be improved.

Although the etching process is cited as an example, according to the substrate processing apparatus of the first embodiment of the present invention, it is possible to reduce the generation of the loading effect and to improve the uniformity of the substrate process across the surface of the wafer W for all of the substrate process in which the loading effect occurs. For example, the substrate processing apparatus of the embodiment can be similarly applied to the film deposition process, and in particular, can be efficiently applied to the CVD film deposition that readily generates the loading effect.

Thus, according to the substrate processing apparatus of the first embodiment of the present invention, uniformity of an etching process across a surface of a wafer can be improved when etching a film deposited on the wafer W in which a pattern is hardly formed, and uniformity across the surface of the wafer W of other various substrate processes can be also improved.

Second Embodiment

<Substrate Processing Apparatus>

Next, a substrate processing apparatus according to a second embodiment of the present invention is described below. In the second embodiment, a point different from the first embodiment is chiefly described, and a point same as or similar to the first embodiment is simplified or omitted.

Figure 10:
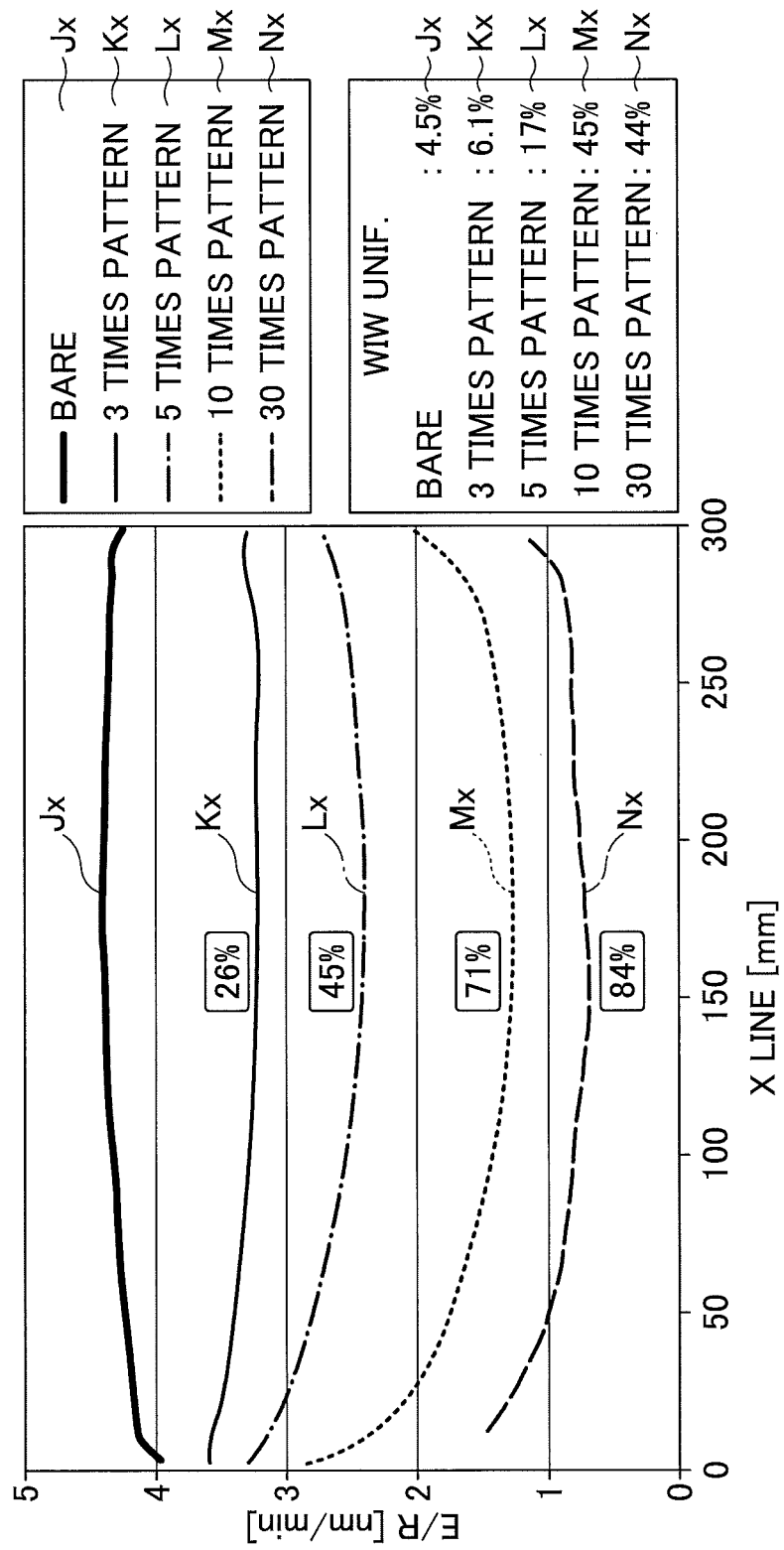
FIG. 10 is a graph showing measured results of etching rates in an X direction along a circumferential direction of a turntable.
Figure 11:
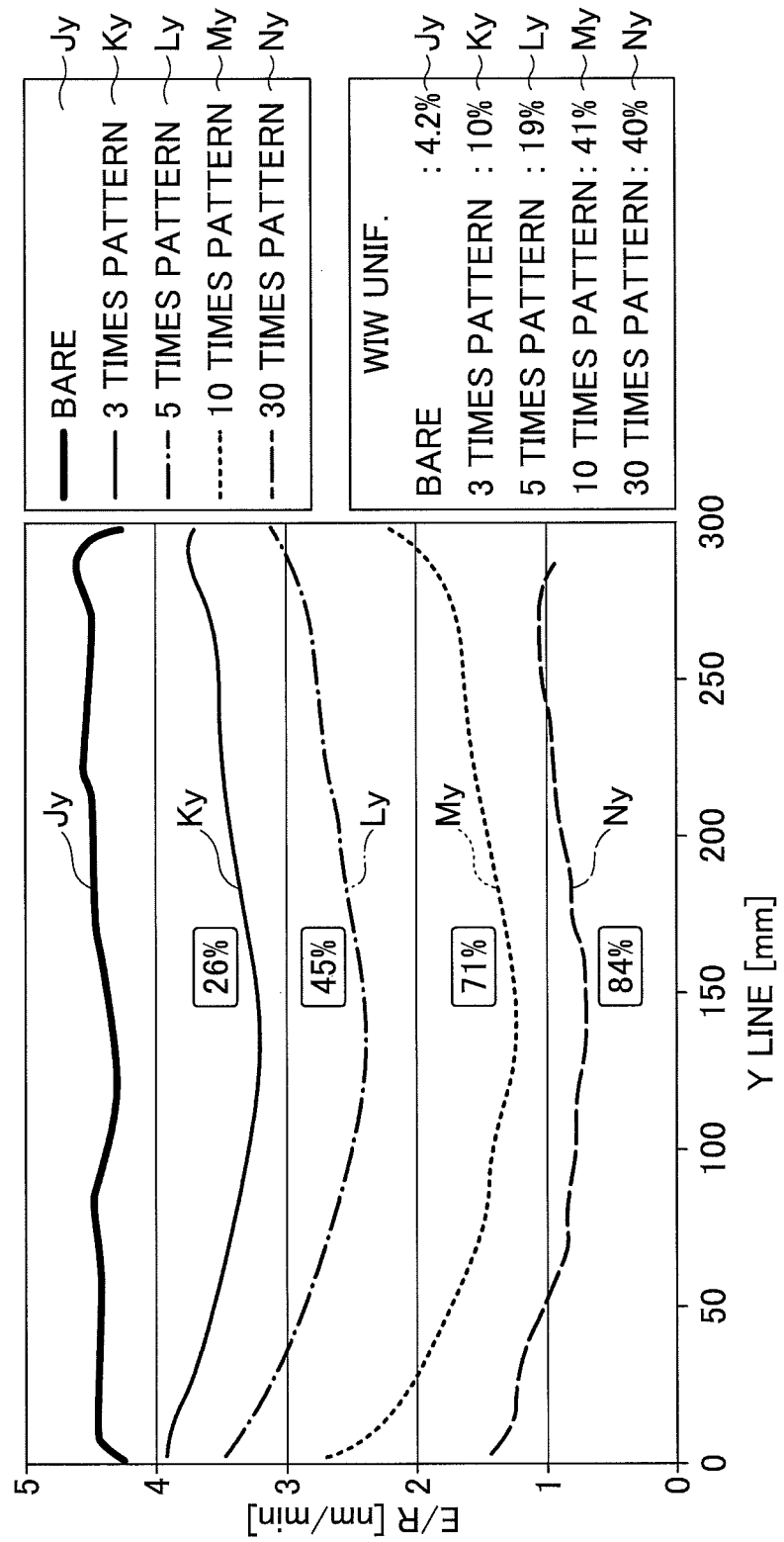
FIG. 11 is a graph showing measured results of etching rates in a Y direction along a radial direction of a turntable.

FIGS. 10 and 11 are diagrams showing experimental results in which a film is deposited on a surface of a wafer including a concavo-convex pattern such as a trench and a via hole formed therein and the film is etched by using a conventional substrate processing apparatus. FIG. 10 is a graph showing measured results of etching rates in the X direction along the circumferential direction of the turntable. FIG. 11 is a graph showing measured results of etching rates in the Y direction along the radial direction of the turntable.

In FIGS. 10 and 11, the horizontal axis shows coordinates (mm) of measured points on the X axis and the Y axis, and the vertical axis shows an etching rate (nm/min). Curves Jx and Jy show etching rates of a bare wafer having a flat surface in which a concavo-convex pattern is not formed, and curves Kx and Ky show etching rates of a wafer W in which a concavo-convex pattern having a triple surface area is formed. Curves Lx and Ly show etching rates of a wafer W having a pattern with a quintuple surface area of the flat surface of the bear wafer, and curves Mx and My show etching rates of a wafer W having a pattern with a tenfold surface area of the flat surface of the bear wafer. Curves Nx and Ny show etching rates of a wafer W having a pattern with a thirtyfold surface area of the flat surface of the bear wafer.

Etching conditions were set as follows: the pressure of the vacuum chamber was 1.3 Torr; the rotational speed of the turntable was 60 rpm; the flow rates of $Ar/CF_4/O_2$ were 5000/10/100 sccm; and the flow rates of $H_2/H_2$—Ar were 0/2000 sccm. Ar gas used as a separation gas was supplied by using three gas nozzles that can separately supply at a portion close to the axis, a middle portion, and a peripheral portion at flow rates of 200 sccm at the portion close to the axis, 500 sccm at the middle portion, and 200 sccm at the peripheral potion, respectively.

As illustrated in FIG. 10, it is noted that the etching rate decreases as the surface area increases due to the concavo-convex pattern formation in the X axis direction. Moreover, it is noted that amounts of etching more widely decrease at the central portion than at the edge of the wafer and that the difference of the etching rate between the edge portion and the central portion increases and the uniformity across the surface of the wafer deteriorates as the surface area increases due to the concavo-convex pattern. More specifically, although the etching rate was high and the uniformity of the etching across the surface of the wafer was preferable in the curve Jx of the bare wafer, both of the etching rate and the uniformity of the etching across the surface of the wafer gradually decreased in the order of the curve Kx having the approximately triple surface area, the curve Lx having the approximately quintuple surface area, the curve Nx having the approximately tenfold surface area, and the curve Nx having the approximately thirtyfold surface area. Here, the uniformity in the X axis direction was as follows: the bear wafer was 4.5%; the wafer having the triple surface area was 6.1%; the wafer having the quintuple surface area was 17%; the wafer having the tenfold surface area was 45%; and the wafer having the thirtyfold surface area was 44%.

FIG. 11 shows the similar tendency. Although the curve Jy of the bare wafer had a high etching rate and a preferable uniformity of the etching across the surface of the wafer, both of the etching rate and the uniformity of the etching across the surface of the wafer gradually decreased in the order of the curve Ky having the approximately triple surface area, the curve Ly having the approximately quintuple surface area, the curve My having the approximately tenfold surface area, and the curve Ny having the approximately thirtyfold surface area. Here, the uniformity in the Y axis direction was as follows: the bear wafer was 4.2%; the wafer having the triple surface area was 10%; the wafer having the quintuple surface area was 19%; the wafer having the tenfold surface area was 41%; and the wafer having the thirtyfold surface area was 40%.

In this manner, even when etching a film deposited on a wafer in which a concavo-convex pattern is formed, the loading effect occurs, and an etching gas is more consumed as a surface area is larger, and an etching rate decreases. Moreover, because a concavo-convex pattern is chiefly formed in a central area of the wafer W and is not or hardly formed in an edge portion, the etching gas is more consumed in the central area, and the etching rate in the central area becomes lower than the etching rate in the edge portion.

Therefore, the substrate processing apparatus according to the second embodiment of the present invention is configured to include a surface area increasing region having a complex concavo-convex pattern around the edge portion of the wafer where only a simple concavo-convex pattern is formed, thereby maintaining a balance between the central area where the complex pattern is formed and the edge portion.

Figure 12:
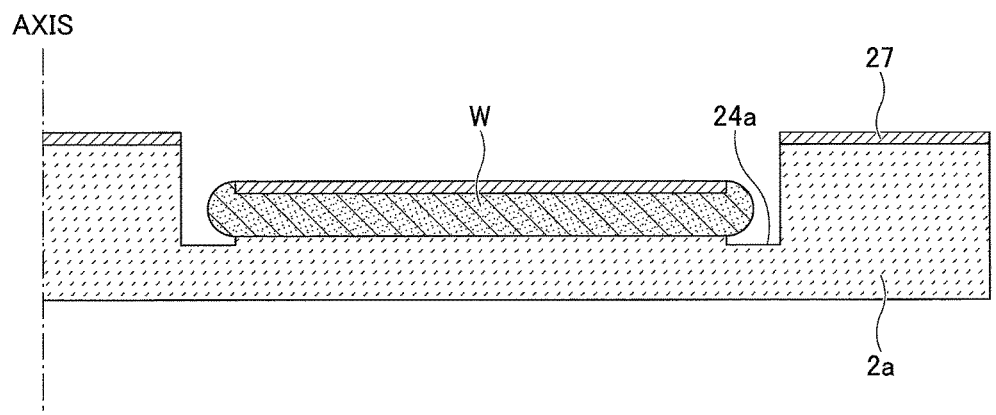
FIG. 12 is a diagram illustrating an example of a substrate processing apparatus according to an embodiment of the present invention.

FIG. 12 is a diagram illustrating an example of the substrate processing apparatus according to the second embodiment of the present invention. The substrate processing apparatus according to the second embodiment includes a surface area increasing region 27 where a concavo-convex pattern is formed in a flat surface outside a concave portion 24a of a turntable 2a, Thus, the surface area can be made approximately equal to the central area of the wafer W, thereby correcting the non-uniformity of the etching rate caused by the loading effect.

Figure 13:
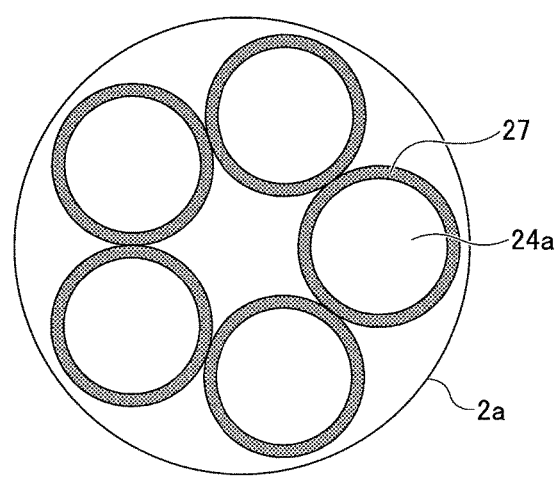
FIG. 13 is a diagram illustrating an example of a planar configuration of a turntable of a substrate processing apparatus according to an embodiment of the present invention.

FIG. 13 is a diagram illustrating an example of a planar configuration of the turntable 2a of the concave portion of the substrate processing apparatus according to the second embodiment of the present invention. FIG. 13 illustrates configuration in which five concave portions 24a are formed in the surface of the turntable 2a and each of the concave portions 24a is surrounded by the ring-shaped surface area increasing region 27. In this manner, the outer circumference of each of the concave portion 24a may be configured to be surrounded by the ring-shaped surface area increasing region 27. Thus, a neighborhood of the edge portion of the wafer having few concavo-convex patterns can have approximately as much surface area as the complex concavo-convex pattern in the central area by providing the surface area increasing region 27, thereby equalizing the etching rate.

Figure 14:
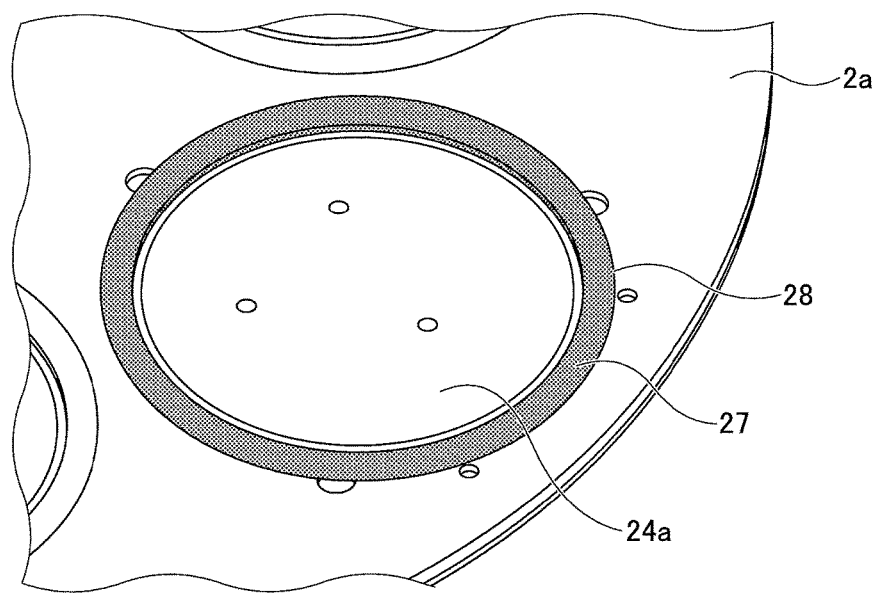
FIG. 14 is a perspective view illustrating an example of forming a surface area increasing region by a ring-shaped member.

FIG. 14 is a perspective view illustrating an example of the surface area increasing region 27 made of a ring-shaped member 28. As illustrated in FIG. 14, the ring-shaped member 28 is installed along the outer circumference of the concave portion 24a, and the surface area increasing region 27 is formed in a surface of the ring-shaped member 28. More specifically, the surface area increasing region 27 is constituted of a groove-like concave-convex pattern. The ring-shaped member 28 may be made of a variety of materials, and for example, may be made of quartz. Because the turntable 2a is made of quartz, using quarts is appropriate to form the concave portion 24a. Moreover, when etching a silicon film (e.g., polysilicon film), the ring-shaped member 28 may be made of silicon while considering the compatibility of the etching object.

Figure 15:
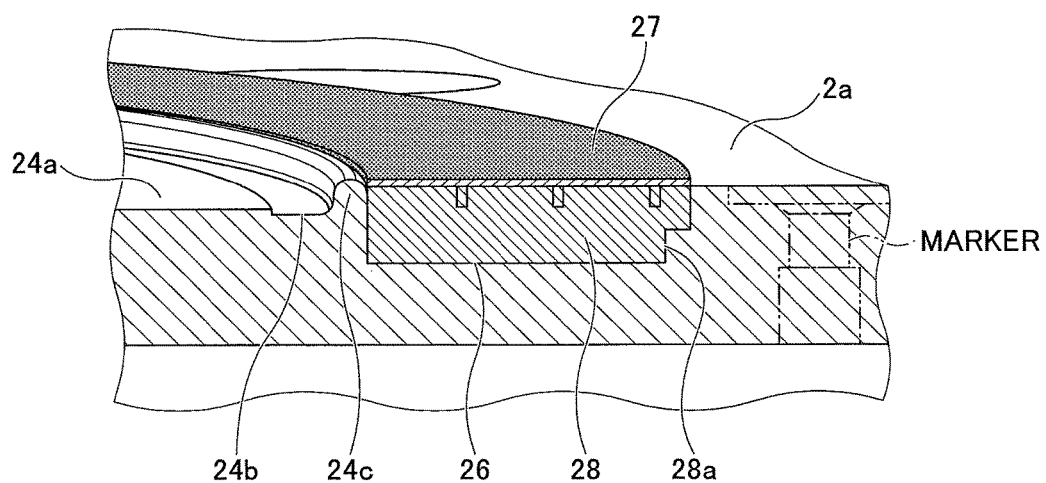
FIG. 15 is a cross-sectional view illustrating a state of a ring-shaped member fit in a turntable.

FIG. 15 is a cross-sectional view illustrating a state of the ring-shaped member 28 installed in the turntable 2a. As illustrated in FIG. 15, the turntable 2a includes an annular installation depression 26 having an inner circumferential diameter larger than the diameter of the concave portion 24a, and the ring-shaped member 28 is fitted in the installation depression 26 therealong. The ring-shaped member 28 may include an engagement structure part 28a to engage with a shape of the installation depression 26 at its bottom surface or lateral surface (contact surface with the installation depression 26).

The surface area increasing region 27 constituted of a concavo-convex pattern is formed in the surface of the ring-shaped member 28, and the concavo-convex pattern can be readily balanced against the concavo-convex pattern formed in the central area of the wafer W by installing the ring-shaped member 28 in the installation depression 26. Here, the concavo-convex pattern can be made a variety of patterns depending on the intended use, and for example, may be made a pattern including a plurality of parallel grooves formed in a flat surface.

The concave portion 24a may include an outer circumferential groove 24b on the outer circumferential side and may further include a bank (protruding portion) 24c formed outside the outer circumferential groove 24b. The outer circumferential groove 24b is provided as necessary in order to decrease contact with quartz of the edge portion of the wafer W (i.e., inner circumferential surface of the concave portion 24a) and to prevent the generation of particles. Moreover, the bank 24c forms the inner circumferential surface of the concave portion 24a, receives the outer circumferential portion of the wafer W moving in the concave portion 24a by a centrifugal force generated by the rotation of the turntable 24a, and holds the wafer in the concave portion 24a. Here, providing the bank is not necessary, and may be configured to form a large concave portion 24a by continuously forming the concave portion 24a and the installation depression 26 together and to form a concave portion 24a by the inner circumferential portion of the ring-shaped member 28 by providing the ring-shaped member 28 in the outer circumferential portion of the large concave portion 24a. In this case, the inner circumferential portion of the ring-shaped member 28 serves as a substrate holding region. In other words, the inner circumferential surface of the ring-shaped member 28 has an inner diameter slightly larger than the outer diameter of the wafer W, and has a function of holding the lateral surface of the wafer W.

Furthermore, a width in the radial direction and a thickness of the ring-shaped member 28 can be a variety of values depending on the intended use, but the thickness may be, for example, made 4 through 6 mm, may be made preferably 5 mm. In addition, a width of the bank 24 may be made an appropriate value depending on the intended use, and for example, may be made 1 through 3 mm, and preferably 2 mm. The outer circumferential groove 24b can be also made an appropriate width and a depth depending on the intended use.

The ring-shaped member 28 is sufficiently fixed to the installation depression 26 by only being placed on the installation depression 26. When a film deposition process is performed in a state of placing the ring-shaped member 28 on the installation depression 26, because the ring-shaped member 28 is fixed on the installation depression 26 so as to be attached to the installation depression 26, fixing by adhesion, bonding and the like is not needed.

Moreover, the ring-shaped member 28 may be divided into a plurality of pieces in the circumferential direction and may have a structure to be formed into an annular shape as a whole. This configuration is particularly convenient when a different amount of increase of the surface area is desired to be set for each region, which makes it possible to perform more accurate surface area adjustment.

Figure 16:
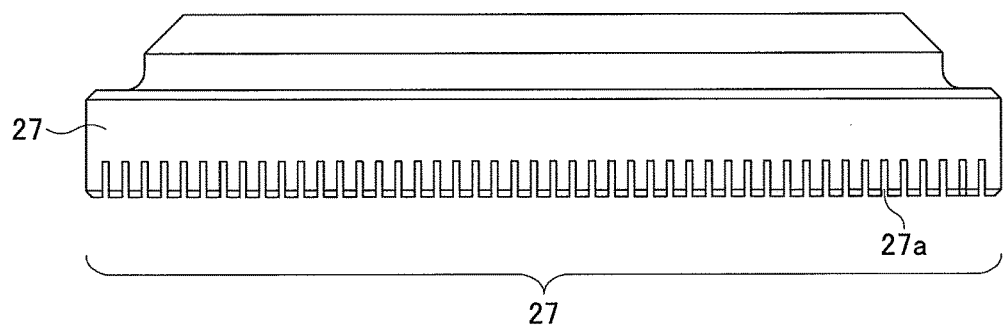
FIG. 16 is a cross-sectional view of an example of a ring-shaped member.

FIG. 16 is a cross-sectional view of an example of the ring-shaped member 28. As illustrated in FIG. 16, a concavo-convex pattern forming the surface area increasing region 27 can be obtained by forming a plurality of grooves 27a parallel with each other in a flat surface. The concavo-convex pattern may be constituted of a variety of patterns. For example, the concavo-convex pattern is constituted by forming a plurality of parallel grooves 27a in a flat surface in this manner. By properly adjusting the width of the grooves 27a, the pitch between the grooves 27a, the depth and the like, how many times larger surface area the concavo-convex pattern has than the surface area of the flat surface, can be adjusted. In addition, when different surface areas are desired to be set on the central side and the peripheral side of the turntable 2a, such adjustment can be performed. For example, by dividing the ring-shaped member 28 into a plurality of pieces and by setting a different surface area for each of the pieces, the arrangement of the pieces can be properly combined depending on the process.

An increasing rate of a surface area by the concavo-convex pattern of the surface area increasing region 27 may be set variously depending on the intended use, and for example, the increasing rate of the surface area may be set properly in a range of 2 to 30 times as large as the surface area of the flat surface depending on the intended use.

Thus, according to the substrate processing apparatus of the second embodiment, even when a substrate process is performed on a wafer in which a complex concavo-convex pattern is formed, the loading effect of a supplying process gas can be reduced, and uniformity of the substrate process across a surface of the substrate can be improved.

Because the substrate processing apparatus according to the second embodiment is configured to the same as the substrate processing apparatus according to the first embodiment other than the points of the configuration of the turntable 2a, the configuration of the concave portion 24a and 26a, and the additionally provided ring-shaped member 28 including the surface area increasing region 27, the description thereof is omitted.

<Substrate Processing Method>

Next, an example of a substrate processing method using the substrate processing apparatus according to the second embodiment of the present invention is described below. A method for forming a $SiO_2$ film in a via hole that is one of concave patterns formed in a wafer W is described below as an example. Here, FIGS. 1 through 6 used in describing the substrate processing apparatus according to the first embodiment are referred to as necessary in the following description. Note that the "turntable 2" and the "concave portion 24" in FIGS. 1 through 6 are replaced by the "turntable 2a" and the "concave portion 24a", respectively, in the following description.

Moreover, the embodiment is described below by citing an example of using an Si-containing gas as a first process gas, an oxidation gas as a second process gas, and a mixed gas of $CF_4$, Ar and $O_2$ (which is hereinafter referred to as "$CF_4/Ar/O_2$ gas") as a fluorine-containing gas.

First, as illustrated in FIG. 2, a gate valve (not illustrated) is opened, and a wafer W is transferred from the exterior by the transfer arm 10 via hole the transfer opening 15 to a region within the pins 25 of the concave portion 24a of the turntable 2a. The transfer of the wafer W is performed by lifting the lift pins (not illustrated) from the bottom side of the vacuum chamber 1 via the through holes 29 (see FIG. 17) that are formed at the bottom surface of the concave portion 24a when the concave portion 24a comes to a halt at a position facing the transfer opening 15. Such a transfer of the wafer W may be performed with respect to each of the five concave portions 24a of the turntable 2 by intermittently rotating the turntable 2 to place a wafer W in each of the concave portions 24a, for example. A concavo-convex pattern composed of a trench and a via hole and the like that more greatly increase a surface area than a flat surface are formed in a surface of the wafer W. The concave portions 24a are formed by installing the ring-shaped member 28 having the surface area increasing region 27 formed in the top surface thereof and having an appropriate increasing amount of the surface area depending on the complexity of the concavo-convex pattern formed in the surface of the wafer W, which corresponds to an increasing rate of the surface area.

Next, the gate valve is closed, and air is drawn out of the interior of the vacuum chamber 1 by the vacuum pump 64. Then, Ar gas as a separation gas is discharged at a predetermined flow rate from the separation gas nozzles 41 and 42, and Ar gas is discharged at a predetermined flow rate from the separation gas supply pipe 51 and the purge gas supply pipes 72 and 73. In turn, the pressure regulating unit 65 adjusts the pressure within the vacuum chamber 1 to a preset processing pressure. Subsequently, the heater unit 7 heats the wafers W up to 450° C., for example, while the turntable 2 is rotated clockwise at a rotational speed of 60 rpm, for example.

Then, a film deposition process is performed. In the film forming process, a Si-containing gas is supplied from the process gas nozzle 31, and an oxidizing gas is supplied from the process gas nozzle 32. Note that in this process, no gas is supplied from the etching gas supply unit 90.

When one of the wafers W passes the first process region P1, the Si-containing gas, as a source gas that is supplied from the process gas nozzle 31, is adsorbed to the surface of the wafer W. Then, as the turntable 2 is rotated, the wafer W having the Si-containing gas adsorbed to its surface passes the separation region D including the separation gas nozzle 42 where the wafer W is purged. Thereafter, the wafer W enters the second process region P2. In the second process region P2, the oxidizing gas is supplied from the process gas nozzle 32, and Si components contained in the Si-containing gas is oxidized by the oxidizing gas. As a result, $SiO_2$ corresponding to a reaction product of the oxidization is deposited on the surface of the wafer W.

The wafer W that has passed the second process region P2 passes the separation region D including the separation gas nozzle 41 where the wafer W is purged. Then, the wafer W again enters the first process region P1. Then, the Si-containing gas that is supplied from the process gas nozzle 31 is adsorbed to the surface of the wafer W.

As described above, in the film deposition process, the turntable 2 is consecutively rotated a plurality of times while supplying the first reaction gas and the second reaction gas into the vacuum chamber 1 but without supplying a fluorine-containing gas into the vacuum chamber 1. In this way, $SiO_2$ corresponding to the reaction product is deposited on the surface of the wafer W and a $SiO_2$ film (silicon oxide film) is formed on the wafer W surface.

Also, if necessary or desired, after the $SiO_2$ film is deposited to a predetermined thickness, the supply of the Si-containing gas from the process gas nozzle 31 is stopped but the oxidizing gas is continuously supplied from the process gas nozzle 32 while rotation of the turntable 2 is continued. In this way, a modification process may be performed on the $SiO_2$ film.

By executing the film deposition process as described above, the $SiO_2$ film is deposited in a via hole corresponding to one example of a concave pattern. The $SiO_2$ film that is first deposited in the via hole may have a cross-sectional shape substantially corresponding to the concave shape of the via hole.

Next, an etching process is performed. In the etching process, the $SiO_2$ film is etched to have a V-shaped cross-sectional shape. In the following, specific process steps of the etching process are described.

As illustrated in FIG. 2, the supply of the Si-containing gas and the oxidizing gas from the process gas nozzles 31 and 32 are stopped, and Ar gas is supplied as a purge gas. The temperature of the turntable 2 is set to a temperature of about 600° C., for example, that is suitable for etching. The rotational speed of the turntable 2 may be set to 60 rpm, for example. In this state, the $CF_4/Ar/O_2$ gas is supplied from the shower head unit 93 of the etching gas supply unit 90, and the $H_2$/Ar gas is supplied from the hydrogen-containing gas supply unit 96 at a preset flow rate, for example, thereby starting the etching process.

Note that at this time, the turntable 2 is rotated at a relatively low speed such that the $SiO_2$ film may be etched to have a V-shaped cross-sectional shape. By etching the $SiO_2$ film in the via hole into a V-shape, a hole having a wide opening at its top portion may be formed in the $SiO_2$ film, and in this way, when filling the hole with a $SiO_2$ film in a subsequent film deposition process, the $SiO_2$ may reach the bottom of the hole such that bottom-up characteristics can be improved and void generation can be prevented in the film forming process.

On this occasion, even if many deep via holes are formed in the surface of the wafer W so as to form a complex concavo-convex pattern that increases the surface area, because the surface area increasing region 27 is formed in the ring-shaped member 28 is formed corresponding to the complex pattern and is arranged to surround the wafer W along the outer circumference of the wafer W, the approximately same amount of etching gas is consumed in the central area of the wafer W where the complex pattern is formed and the outer peripheral portion of the wafer W where the complex pattern is not formed, and the etching process is performed at an uniform etching rate across the surface of the wafer W.

Moreover, as described above, because the downward protruding surface 93c is provided at the outer peripheral portion of the lower surface 93b of the shower head unit 93, the decrease in etching energy on the outer peripheral side inside the etching region P3 can be prevented, and the etching rate can be made more uniform.

Thus, the fluorine-containing gas and the hydrogen-containing gas are supplied into the vacuum chamber 1 without supplying the first reaction gas and the second reaction gas while continuously rotating the turntable 2 a plurality of times. Thus, the $SiO_2$ film is etched.

Next, the above-described film deposition process is performed again. In the film deposition process, a $SiO_2$ film is further deposited on the $SiO_2$ film etched into the V-shape in the etching process, and the film thickness is increased. Because the film is deposited on the $SiO_2$ film etched into the V-shape, an entrance (upper portion) is not filled with the film in the film deposition, and the film can be deposited on and from the bottom portion of the $SiO_2$ film.

Next, the above-described etching process is performed again. In the etching process, the $SiO_2$ film is etched in a V-shape.

The above-described film deposition process and the etching process are alternately repeated a necessary number of times, and the via hole is filled with the $SiO_2$ film while preventing a void from being generated in the $SiO_2$ film. The number of repetitions of these processes may be set at an appropriate number of times depending on a shape including an aspect ratio of a concave-shaped pattern of the via hole and the like. For example, when the aspect ratio is high, the number of repetitions increases. Moreover, the number of repetitions for filling the via hole is expected to be more than the number of repetitions for filling the trench.

Here, in the present embodiment, an example of filling the concave-shaped pattern formed in the surface of the wafer W with the film by repeating the film deposition process and the etching process, has been described, but the present invention is not limited to this example.

For example, after carrying a wafer W on which a film is preliminarily deposited into the vacuum chamber 1, only the etching process may be performed on the wafer W.

Furthermore, for example, the first process gas, the second process gas, the fluorine-containing gas and the hydrogen-containing gas are supplied into the vacuum chamber 1 at the same time while continuously rotating the turntable 2 a plurality of times, the film deposition process and the etching process may be performed one time for each rotation of the turntable 2. In addition, a cycle of performing each of the film deposition process and the etching process one time may be repeated a plurality of times.

According to the substrate processing apparatus and the substrate processing method according to the second embodiment, an uniform etching process can be performed on a film deposited on a wafer W by providing the ring-shaped member 28 including the surface area increasing region 27 that increases the surface area outside the concave portion 24a along the outer circumference of the concave portion 24a that serves as a substrate holding region.

In FIGS. 14 and 16, the ring-shaped member 28 is described by citing an example of having the concavo-convex pattern in the entire top surface, but when the amount of increase in the surface area due to the concavo-convex pattern is too much, the pattern formed in the top surface may properly include a flat surface so as to form a mixed pattern of the concavo-convex pattern and the flat surface.

Third Embodiment

Figure 17:
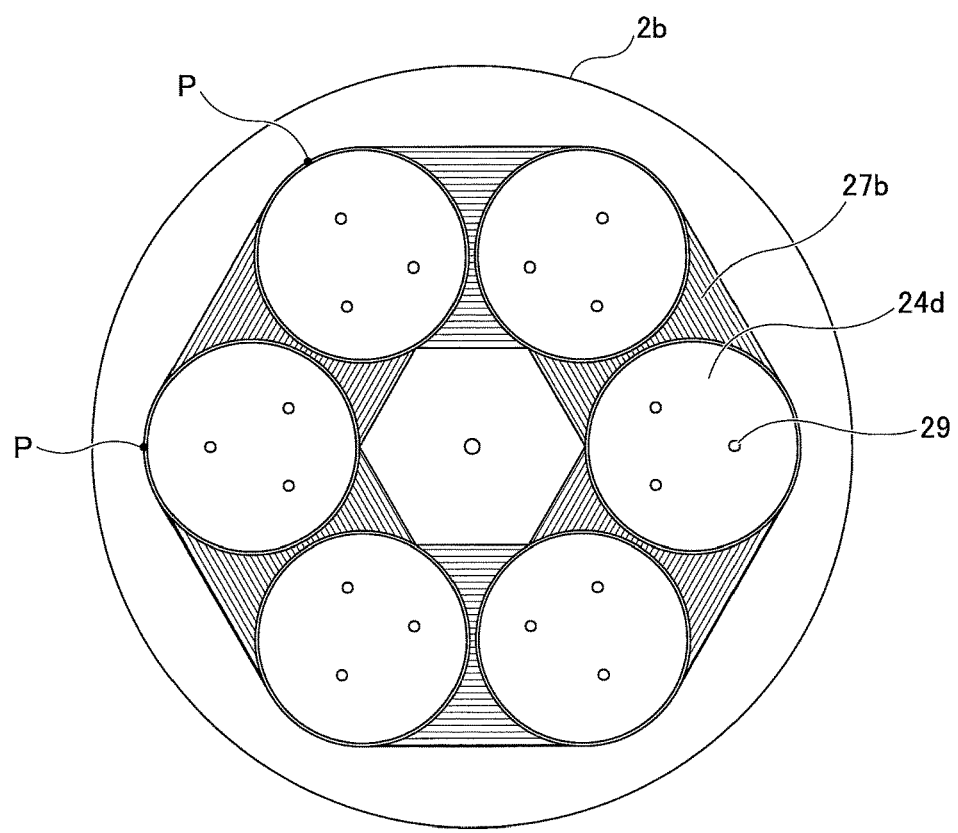
FIG. 17 is a diagram illustrating an example of a turntable of a substrate processing apparatus according to an embodiment of the present invention.

FIG. 17 is a diagram illustrating an example of a turntable 2b of a substrate processing apparatus according to a third embodiment of the present invention. The substrate processing apparatus according to the third embodiment is common to the substrate processing apparatus according to the second embodiment in that a surface area increasing region 27b including a concavo-convex pattern is provided around the concave portion 24d that serves as a substrate holding region but differs from the substrate processing apparatus according to the second embodiment in that the concavo-convex pattern is directly formed in the surface of the turntable 2b.

Thus, the surface area increasing region 27b may be provided by directly forming the concavo-convex pattern in the surface of the turntable 2b, without using a separate member from the turntable 2a such as the ring-shaped member 28. The surface area increasing region 27b may be provided at a variety of regions depending on the intended use, but is preferably provided to surround at least ⅔ the outer circumference of the wafer W, and more preferably at least ¾ thereof. For example, in FIG. 17, because the outermost points P of adjacent concave portions 24d are linearly connected with each other, the outer circumference on and around the outermost points P, which corresponds to a portion less than ¼, and in a range of ⅙ through ⅛ of the entire outer circumference, is not surrounded by the surface area increasing region 27b. At least the straight line connecting the adjacent outermost points P with each other is made a minimal standard, and preferably, the surface area increasing region 27b is also provided outside the minimal standard.

Moreover, the surface area increasing region 27b illustrated in FIG. 17 is formed into a hexagonal shape and a geometrically similar hexagonal shape is formed in the central area. Then, concavo-convex patterns are formed throughout a portion between the inner hexagon and the outer hexagon. Thus, when the concavo-convex pattern is directly formed in the turntable 2b, the concavo-convex pattern can be formed not only at a location close to the concave portion 24d but also at a location apart from the concave portion 24d.

Furthermore, the concavo-convex pattern of the surface area increasing region 27b may be formed into a variety of shape patterns depending on the intended use. For example, similar to the second embodiment, the pattern may be provided by forming a groove into a flat surface. In FIG. 17, the outer circumference of the surface area increasing region 27b is formed into a hexagonal shape, and the pattern is provided by forming a plurality of grooves in parallel with sides of the hexagon.

Figure 18:
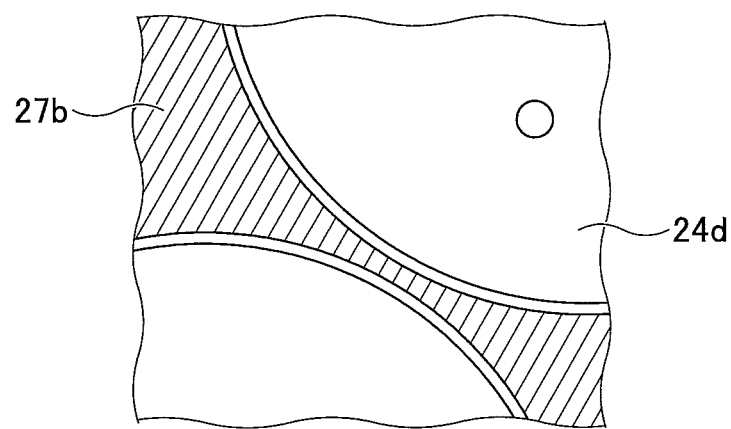
FIG. 18 is a diagram illustrating a surface of a concave portion and a concavo-convex pattern of a surface area increasing region.

FIG. 18 is a diagram illustrating the concave portion 24d and a surface of a concavo-convex pattern of the surface area increasing region 27. As illustrated in FIG. 18, for example, the surface of the surface area increasing region 27b may be constituted of a stripe pattern in which a plurality of parallel grooves is formed.

Figure 19:
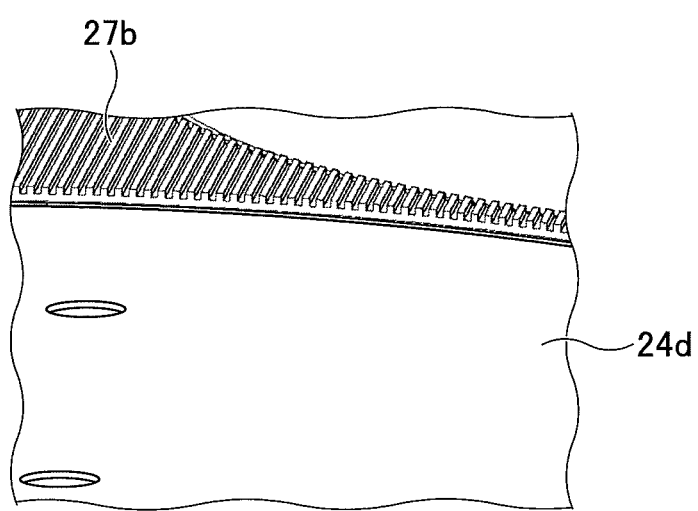
FIG. 19 is a perspective view of a surface of a concave portion and a concavo-convex pattern of a surface area increasing region.

FIG. 19 is a perspective view of the concave portion 24d and a concavo-convex pattern of the surface area increasing region 27b. As illustrated in FIG. 19, the concavo-convex pattern may be constituted by forming a plurality of grooves in parallel with each other in the surface of the turntable 2b.

In the substrate processing apparatus according to the third embodiment, the concavo-convex pattern is formed in the whole of a predetermined area by forming the surface area increasing region 27b in the surface of the turntable 2b, thereby more increasing the surface area than a flat surface.

Because a substrate processing method according to the third embodiment is approximately the same as the substrate processing method according to the second embodiment, the description is omitted.

EXPERIMENTAL RESULTS

Subsequently, experimental results performed to invent the substrate processing apparatus and the substrate processing method according to the second and third embodiments are described below.

Figure 20:
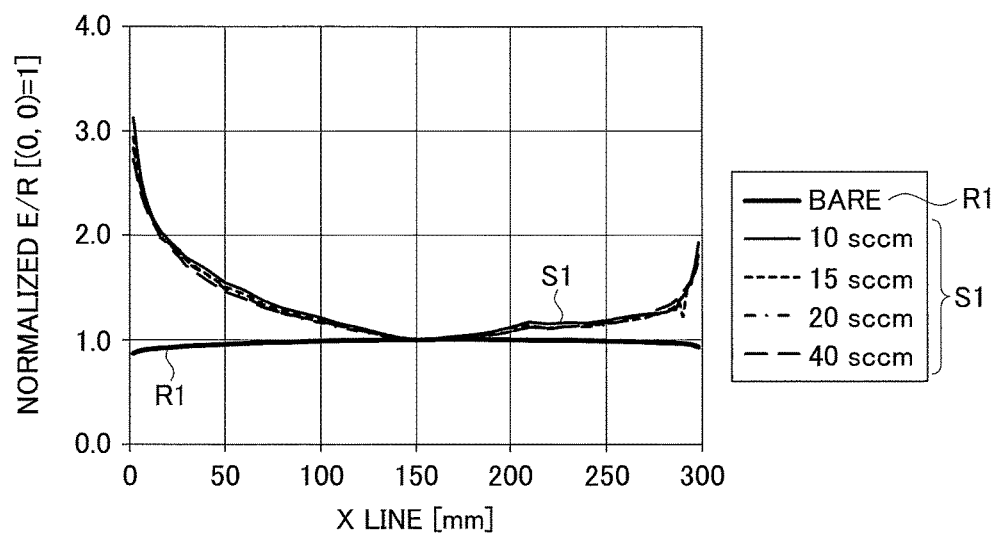
FIG. 20 is a graph for comparing an etching rate of a film deposited on a wafer in which a pattern is formed on an X axis to an etching rate of a film deposited on a flat surface by changing a flow rate of $CF_4$ in a conventional substrate processing apparatus.

FIG. 20 is a graph for comparing etching rates on an X axis of a homogeneous film deposited on a flat surface of a bear wafer to a film deposited on a wafer W having a pattern that generates a thirtyfold surface area of the flat surface by using a conventional substrate processing apparatus while changing a flow rate of $CF_4$. As illustrated in FIG. 20, the etching rate of the bear wafer was constant even when the flow rate of $CF_4$ was changed to 10 sccm, 15 sccm, 20 sccm and 40 sccm. With respect to the patterned wafer W, the etching rate characteristics did not change even when the flow rate of $CF_4$ was changed to 10 sccm, 15 sccm, 20 sccm and 40 sccm. However, the etching rate at the edge portion was higher than the etching rate at the central area, and the loading effect did not improve at all.

Figure 21:
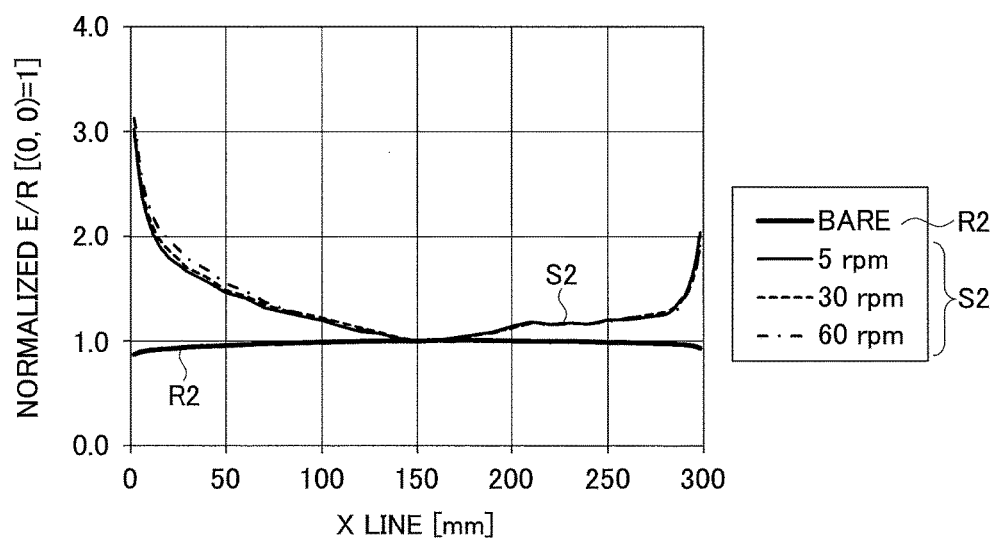
FIG. 21 is a graph for comparing an etching rate of a film deposited on a wafer in which a pattern is formed on an X axis to an etching rate of a film deposited on a flat surface by changing a rotational speed of a turntable in a conventional substrate processing apparatus.

FIG. 21 is a graph for comparing etching rates on an X axis of a homogeneous film deposited on a flat surface of a bear wafer to a film deposited on a wafer W having a pattern that generates a thirtyfold surface area of the flat surface by using a conventional substrate processing apparatus while changing a rotational speed of the turntable. As illustrated in FIG. 21, the etching rate of the bear wafer was constant even when the rotational speed of the turntable was changed to 5 rpm, 30 rpm, and 60 rpm. With respect to the patterned wafer W, the etching rate characteristics did not change even when the rotational speed of the turntable was changed to 5 rpm, 10 rpm, and 60 rpm. However, the etching rate at the edge portion was higher than the etching rate at the central area, and the loading effect did not improve at all.

Figure 22:
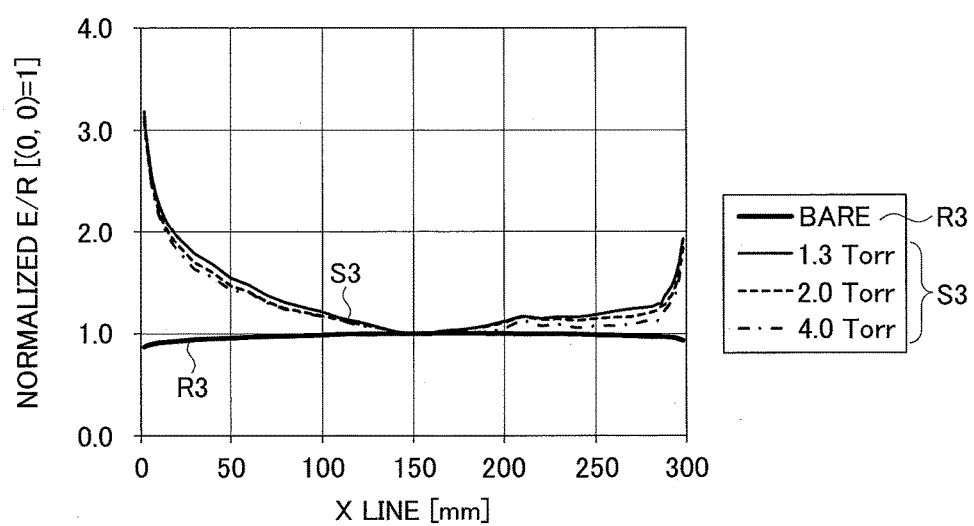
FIG. 22 is a graph for comparing an etching rate of a film deposited on a wafer in which a pattern is formed on an X axis to an etching rate of a film deposited on a flat surface by changing a pressure in a vacuum chamber in a conventional substrate processing apparatus.

FIG. 22 is a graph for comparing etching rates on an X axis of a homogeneous film deposited on a flat surface of a bear wafer to a film deposited on a wafer W having a pattern that generates a thirtyfold surface area of the flat surface by using a conventional substrate processing apparatus while changing a pressure in the vacuum chamber. As illustrated in FIG. 22, the etching rate of the bear wafer was constant even when the pressure in the vacuum chamber was changed to 1.3 Torr, 2.0 Torr, and 4.0 Torr. With respect to the patterned wafer W, the etching rate characteristics did not change even when the pressure in the vacuum chamber was changed to 1.3 Torr, 2.0 Torr, and 4.0 Torr. However, the etching rate at the edge portion was higher than the etching rate at the central area, and the loading effect did not improve at all.

Thus, even though the process conditions were changed, the conditions that reduce the loading effect and improve the uniformity of the etching process across the surface of the wafer cannot be found when the conventional substrate processing apparatus was used.

Figure 23:
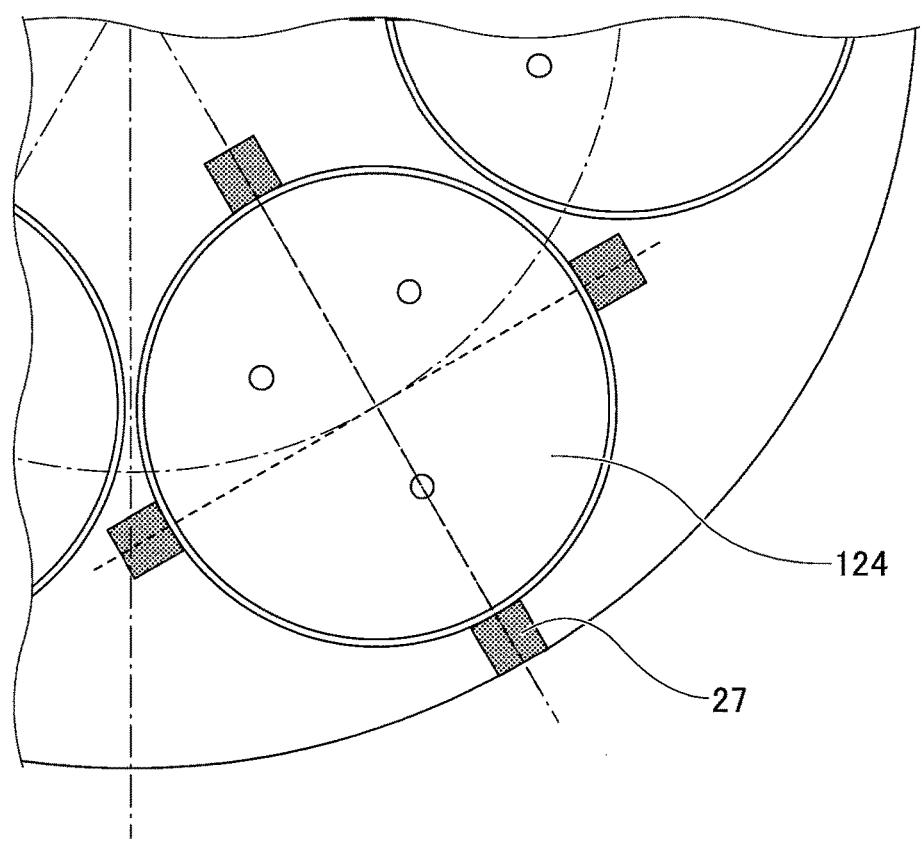
FIG. 23 is a diagram for explaining an experimental method of performing an etching process by providing surface area increasing regions at four locations at a periphery of a conventional substrate processing apparatus.

FIG. 23 is a diagram for illustrating an experimental method in which four surface area increasing regions 27 are provided at two locations on an X axis and two locations on a Y axis around a concave portion 124 of a conventional substrate processing apparatus. As illustrated in FIG. 23, the surface area increasing regions 27 having concavo-convex patterns formed in a surface thereof were provided at four locations and trial experiments of performing etching processes were performed.

Figure 24:
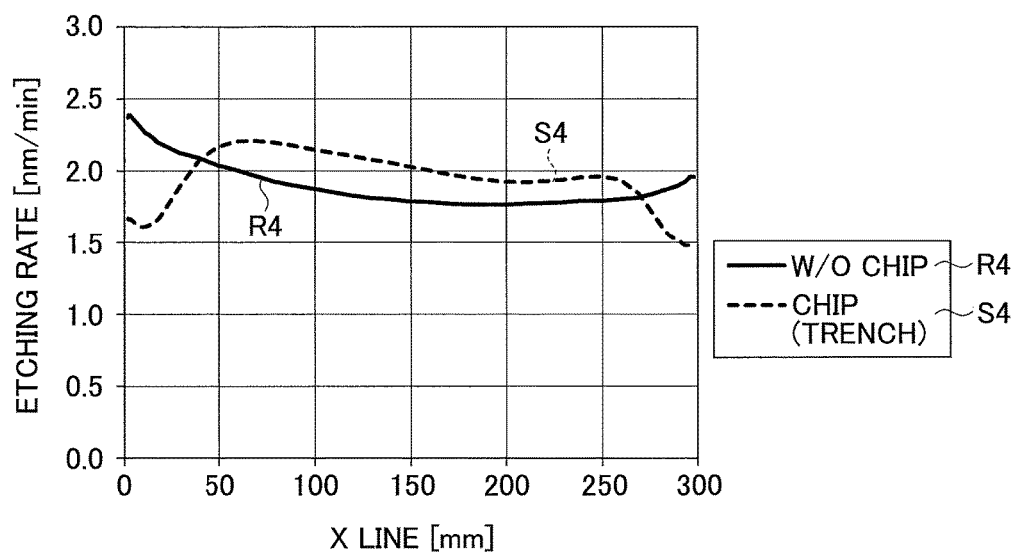
FIG. 24 is an experimental result on an X line of a trial experiment shown in FIG. 23.

FIG. 24 shows an experimental result of the trail experiment on the X axis. As illustrated in FIG. 24, by providing the surface area increasing regions 27 at two outer locations on the X axis, the etching rate at the edge portion enhanced as shown by a curve R4 with respect to the wafer W without the concavo-convex pattern. In contrast, with respect to the wafer W in which the concavo-convex was formed, as shown by a curve S4, the etching rate at the edge portion decreased. This means that the consumed amount of etching gas increased and that the etching rate at the edge portion was able to be decreased by providing the surface area increasing region 27. In FIG. 24, because an effect of the surface area increasing region 27 was too great, the uniform etching rate could not be obtained, but the uniform etching rate could be obtained by providing a surface area increasing region 27 having a less increasing amount of surface area. Thus, the result indicated that the etching rate at the edge portion was able to be balanced against the concavo-convex pattern formed in the central area by providing the surface area increasing region 27 so as to surround the wafer W.

Figure 25:
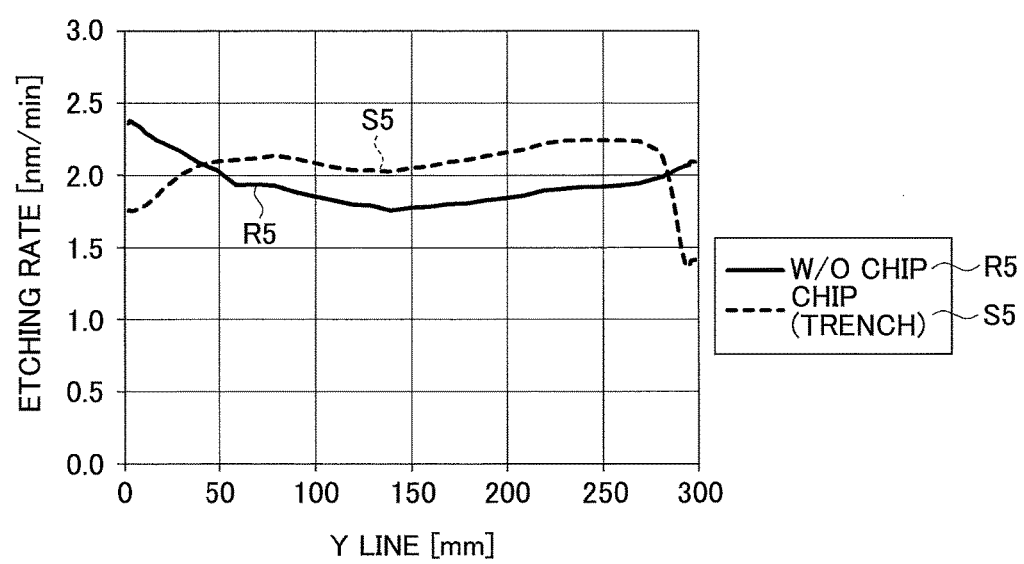
FIG. 25 is an experimental result on a Y line of the trial experiment shown in FIG. 23.

FIG. 25 shows an experimental result on the Y axis of the trial experiment illustrated in FIG. 23. As illustrated in FIG. 25, by providing the surface area increasing regions 27 at two outer locations on the Y axis, the etching rate at the edge portion enhanced as shown by a curve R5 with respect to the wafer W without the concavo-convex pattern. In contrast, with respect to the wafer W in which the concavo-convex was formed, as shown by a curve S5, the etching rate at the edge portion decreased. This means that the consumed amount of etching gas increased and that the etching rate at the edge portion was able to be decreased by providing the surface area increasing region 27. In FIG. 25, because an effect of the surface area increasing region 27 was too great, the uniform etching rate could not be obtained, but the uniform etching rate could be obtained by providing a surface area increasing region 27 having a less increasing amount of surface area. Thus, the result indicated that the etching rate at the edge portion was able to be balanced against the concavo-convex pattern formed in the central area by providing the surface area increasing region 27 so as to surround the wafer W.

As shown by FIGS. 24 and 25, the experimental results indicated that an etching gas consumption state similar to the concavo-convex pattern formed in the surface of the wafer W can be created by providing the surface area increasing region 27 outside the wafer W and that the etching rate can be made uniform. Hence, according to the substrate professing apparatus and the substrate professing method of the second and third embodiments utilizing such a property, uniformity of a substrate process across a surface of a substrate can be improved even when a substrate having a complex pattern in a surface thereof is processed.

As described above, according to the substrate processing apparatus and the substrate processing method of the embodiments of the present invention, uniformity of a substrate process across a surface of the substrate can be improved.

All examples and conditional language recited herein are intended for pedagogical purposes to aid the reader in understanding the embodiments and the concepts contributed by the inventor to furthering the art, and are to be construed as being without limitation to such specifically recited examples and conditions, nor does the organization of such examples in the specification relate to a showing of superiority or inferiority of the embodiments. Although the method of manufacturing the silicon oxide film has been described in detail, it should be understood that the various changes, substitutions, and alterations could be made hereto without departing from the spirit and scope of the invention.

What is claimed is:

1. A substrate processing apparatus comprising:
   a process chamber;
   a turntable provided in the process chamber and including a substrate holding region formed in a top surface along a circumferential direction of the turntable, the substrate holding region having a first depth;
   a surface area increasing region provided in the top surface of the turntable around the substrate holding region and configured to increase a surface area of the top surface of the turntable to an area larger than a surface area of a flat surface by including a concavo-convex pattern in its top surface, the concavo-convex pattern having a second depth that is shallower than the first depth of the substrate holding region; and
   a process gas supply unit configured to supply a process gas to the top surface of the turntable.

2. The substrate processing apparatus according to claim 1, wherein the surface area increasing region has an annular shape along an outer circumference of the substrate holding region.

3. The substrate processing apparatus according to claim 1, wherein the concavo-convex pattern is a pattern that increases a surface area in a range of 2 to 30 times as large as the surface area of the flat surface.

4. The substrate processing apparatus according to claim 1, wherein the turntable is made of quartz.

5. The substrate processing apparatus according to claim 1,
   wherein the process gas supply unit is an etching gas supply unit configured to supply an etching gas, and
   the etching gas supply unit is provided in an etching region provided along the circumferential direction of the turntable.

6. The substrate processing apparatus according to claim 5, further comprising:
   a source gas supply region including a source gas supply unit and provided apart from the etching region in the circumferential direction of the turntable; and
   a reaction gas supply region including a reaction gas supply unit and provided between the source gas supply region and the etching region in the circumferential direction of the turntable.

7. The substrate processing apparatus according to claim 6, further comprising:
   purge gas supply units configured to supply a purge gas to the top surface of the turntable and provided between the etching region and the source gas supply region and between the source gas supply region and the reaction gas supply region.

8. A substrate holding member used in a substrate processing apparatus configured to process a substrate while holding the substrate in a predetermined substrate holding region provided in a top surface of a turntable, the substrate holding region having a first inner diameter and a first depth to hold the substrate therein, comprising:
   an annular body having a second inner diameter larger than the first inner diameter of the substrate holding region;
   a fitting portion to be installed in the substrate holding region of the turntable, the fitting portion including an outer side surface and an outer bottom surface to be formed to fit in the substrate holding region of the turntable; and
   a concavo-convex pattern that increases a surface area to an area larger than a surface area of a flat surface and formed in a top surface of the annular body, the concavo-convex pattern having a second depth that is shallower than the first depth of the substrate holding region.

9. The substrate holding member according to claim 8, wherein the substrate holding member is divided into a plurality of pieces in a circumferential direction thereof.

10. The substrate holding member according to claim 8, wherein the concavo-convex pattern increases the surface area in a range of 2 to 30 times as large as the surface area of the flat surface.

* * * * *